(12) United States Patent
Bolin et al.

(10) Patent No.: US 9,875,582 B2
(45) Date of Patent: Jan. 23, 2018

(54) MOTOR UNIT CONTACTLESS PASSIVE OPERATION TIME COUNTER

(71) Applicant: Liko Research & Development AB, Lulea (SE)

(72) Inventors: Andreas Bolin, Gammelstad (SE); Karin Olsson, Sodra Sunderbyn (SE); Göran Eriksson, Lulea (SE); Nicolas Thenault, Lulea (SE); Håkan Lindholm, Sundsvall (SE)

(73) Assignee: Liko Research & Development AB, Lulea (SE)

( * ) Notice: Subject to any disclaimer, the term of this patent is extended or adjusted under 35 U.S.C. 154(b) by 36 days.

(21) Appl. No.: 15/081,233

(22) Filed: Mar. 25, 2016

(65) Prior Publication Data

US 2016/0313377 A1 Oct. 27, 2016

Related U.S. Application Data

(60) Provisional application No. 62/166,755, filed on May 27, 2015, provisional application No. 62/151,139, filed on Apr. 22, 2015.

(51) Int. Cl.
*G07C 3/04* (2006.01)
*G07C 3/06* (2006.01)
(Continued)

(52) U.S. Cl.
CPC ............... *G07C 3/06* (2013.01); *G07C 3/04* (2013.01); *G01R 1/22* (2013.01); *G01R 15/181* (2013.01);
(Continued)

(58) Field of Classification Search
CPC ...... G01R 15/181; G01R 15/207; G01R 1/22; G01R 31/343; G01R 19/0092; G07C 3/04; G07C 3/06
(Continued)

(56) References Cited

U.S. PATENT DOCUMENTS

| 5,029,188 A | 7/1991 | Lexa |
| 5,124,960 A * | 6/1992 | Miller ................. G04B 37/086 |
| | | 368/107 |

(Continued)

FOREIGN PATENT DOCUMENTS

| CA | 2 302 060 | 9/2001 |
| GB | 2 477 964 A | 8/2011 |

OTHER PUBLICATIONS

Daricek, Martin Donoval-Martin, and Viera Stopjaková-Daniel Donoval. "Magnetic fet-based on-chip current sensor for current testing of low-voltage circuits." Journal of Electrical Engineering 59.3 (2008): 122-130.*

(Continued)

*Primary Examiner* — Jermele M Hollington
*Assistant Examiner* — Christopher McAndrew
(74) *Attorney, Agent, or Firm* — Barnes & Thornburg LLP

(57) ABSTRACT

An apparatus is provided that measures usage of a motor unit having a motor and a motor cable leading to the motor to provide operational power to the motor. The apparatus includes a housing that attaches to the motor cable such that the motor cable passes through an interior region of the housing. A sensor is situated in the interior region of the housing and is operable to sense current that flows in the motor cable. The apparatus has a counter that logs accumulated time of operation of the motor based on an amount of time that current is sensed by the sensor to be flowing in the motor cable.

20 Claims, 19 Drawing Sheets

(51) Int. Cl.
*G01R 15/18* (2006.01)
*G01R 1/22* (2006.01)
*G01R 15/20* (2006.01)
*G01R 19/00* (2006.01)
*G01R 31/34* (2006.01)

(52) U.S. Cl.
CPC ........ *G01R 15/207* (2013.01); *G01R 19/0092* (2013.01); *G01R 31/343* (2013.01)

(58) Field of Classification Search
USPC ........................................................ 324/126
See application file for complete search history.

(56) References Cited

U.S. PATENT DOCUMENTS

| | | | |
|---|---|---|---|
| 5,337,003 A | | 8/1994 | Carmichael et al. |
| 5,809,591 A | | 9/1998 | Capaldi et al. |
| 6,472,878 B1 * | 10/2002 | Bruchmann | G01R 15/202 |
| | | | 324/117 H |
| 6,894,439 B2 * | 5/2005 | Stewart | H02M 7/003 |
| | | | 307/150 |
| 7,400,986 B2 * | 7/2008 | Latham | G07C 3/04 |
| | | | 324/110 |
| 7,415,011 B2 * | 8/2008 | Garnett | G11B 33/126 |
| | | | 370/386 |
| 8,474,794 B2 | 7/2013 | Liljedahl | |
| 9,028,320 B2 * | 5/2015 | Romano | G07C 15/006 |
| | | | 463/22 |
| 2002/0149502 A1 | 10/2002 | Goss | |
| 2003/0030954 A1 * | 2/2003 | Bax | H01H 83/226 |
| | | | 361/87 |
| 2003/0076474 A1 | 4/2003 | Zick | |
| 2003/0076744 A1 * | 4/2003 | Zick | G07C 3/04 |
| | | | 368/9 |
| 2004/0095125 A1 | 5/2004 | Jones | |
| 2004/0229681 A1 * | 11/2004 | Romano | G07C 15/006 |
| | | | 463/22 |
| 2007/0084462 A1 * | 4/2007 | Allen | A61M 15/0065 |
| | | | 128/200.23 |
| 2010/0328852 A1 * | 12/2010 | Johnson | H01R 25/16 |
| | | | 361/641 |
| 2012/0184350 A1 * | 7/2012 | Romano | G07C 15/006 |
| | | | 463/22 |
| 2014/0055122 A1 | 2/2014 | Todd et al. | |

OTHER PUBLICATIONS

Redington Counters, Inc. P.O. Box 608, 130 Addison Road, Windsor, CT 06095 Toll Free: (860) 688-6205 o Fax: 860/688-1591 E-Mail: Info@RedingtonCounters.com o Website: www.RedingtonCounters.com.*

European Search Report from EP 16 16 5140, dated Aug. 18, 2016, 11 pages.

* cited by examiner

MOTOR UNIT CONTACTLESS PASSIVE OPERATION TIME COUNTER

CROSS REFERENCE TO RELATED APPLICATIONS

The present application claims the benefit, under 35 U.S.C. §119(e), of U.S. Provisional Application Nos. 62/166,755, filed May 27, 2015, and 62/151,139, filed Apr. 22, 2015, each of which is hereby incorporated by reference herein.

BACKGROUND

The present disclosure relates to motor units, such as linear actuators, and particularly, to determining the amount of usage of motors of motor units. More particularly, the present disclosure relates to motor unit contactless passive operation time counters.

Motor units are used in a wide variety of equipment including healthcare equipment. For example, patient lifts and patient beds oftentimes use linear actuators to move one portion of these devices relative to another portion. In many existing devices using linear actuators, there is no way to determine the overall time of operation of the motor unit. Thus, it is difficult to know when maintenance or replacement of these motor units should occur.

Systems have been proposed in which the existing internal electronics of the motor unit is tapped into to determine the time of usage of the motor unit. However, engaging with existing electronics in this manner possibly may affect existing certifications for some equipment, particularly healthcare equipment, and also presents challenges with regard to retrofitting of existing equipment. What is needed is an operation time counter for a motor unit that is passive and that can be easily added to existing systems without the need for re-certification of the existing system.

SUMMARY

An apparatus, system, or method may comprise one or more of the features recited in the appended claims and/or the following features which, alone or in any combination, may comprise patentable subject matter:

An apparatus that may measure usage of a motor unit having a motor and a motor cable leading to the motor to provide operational power to the motor may be provided. The apparatus may include a housing that may attach to the motor cable such that the motor cable may pass through an interior region of the housing. A sensor may be situated in the interior region of the housing and may be operable to sense current that may be flowing in the motor cable. The apparatus may have a counter that may log accumulated time of operation of the motor based on an amount of time that current may be sensed by the sensor to be flowing in the motor cable.

In some embodiments, the housing may include a removable cover, a base, a first strain relief that may be at one end of the base, and a second strain relief that may be at the second end of the base. The first strain relief may clamp the motor cable to the base at the first end and the second strain relief may clamp the motor cable to the base at the second end. The sensor may include a circuit board that may be situated in the base of the housing between the first and second strain reliefs and at least one integrated circuit chip may be situated on the circuit board. The motor cable may be oriented so as to lie adjacent the integrated circuit chip on the circuit board.

In some embodiments, the sensor may include at least one layer of metallic foil that may be wrapped around the circuit board, the integrated circuit chip on the circuit board, and a portion of the motor cable that is situated inside the housing. For example, the at least one layer of metallic foil may include a plurality of layers of metallic foil. In one embodiment, there are four layers of foil.

According to this disclosure, the counter may include a display that may be operable to display the accumulated time of use of the motor. The accumulated time of use of the motor may be displayed for a threshold amount of time after a button on a counter housing is pressed. For example, the threshold amount of time may be about ten seconds in some embodiments. If desired, the accumulated time of use of the motor may be displayed in minutes and seconds.

In some embodiments, the apparatus further includes a cable that may electrically interconnect the counter and the sensor in the interior region of the housing. The sensor and the counter may be electrically powered by at least one battery that may be located in the counter. Alternatively or additionally, the counter and sensor may receive power from an external DC power source. The counter may have an adhesive patch that may permit the counter to be coupled to a surface of a device having the motor unit in spaced relation with the housing in which the sensor is situated.

According to some embodiments of this disclosure, the sensor may be configured to estimate an amount of current by detecting a strength of a force field in the motor cable. Estimating the amount of current may include amplifying and processing the detected force field, for example.

In some embodiments, the counter may include a display that may display information relating to one or more of the following: battery status; overload; counts of cycles; operation time; statistics during time intervals selected from at least one of day, month, and year; load or weight of patient, or service demand or necessity. If desired, the counter may include wireless communication capability to transmit data to one or more of the following: a handheld display, a hand control, or a network of a healthcare facility. Alternatively or additionally, the wireless communication capability of the counter may include receiving wirelessly transmitted data from other devices for display or retransmission. In some embodiments, an additional cable may extend from the counter and may be coupleable to an output of a control box of the motor unit to receive data therefrom.

In some embodiments, the base of the sensor housing may include a coupling boss to which the cover may be fastened with a fastener. The at least one metallic foil layer may include an aperture through which the coupling boss may extend when the at least one layer of metallic foil is wrapped around the circuit board, the integrated circuit chip on the circuit board, and the portion of the motor cable that is situated inside the housing. Also, the circuit board may include an opening through which the coupling boss of the base of the sensor housing may project.

According to an aspect of this disclosure a method may include opening a cover of a housing that may contain a sensor and routing a motor cable of a motor unit through the housing so that a portion of the motor cable may be situated adjacent an integrated circuit chip of the sensor. The method may further include wrapping at least one layer of metallic foil around the portion of the motor cable and the integrated circuit chip of the sensor and closing the cover so that the portion of the cable with the at least one layer of metallic foil wrapped therearound may be retained in the housing. The method may also include operating a motor of the motor unit and logging an accumulated amount of time of operation of the motor with a counter based on an amount of time that current may be sensed by the sensor to be flowing in the motor cable.

In some embodiments, the method may further include securing the motor cable to the housing using first and second strain reliefs. Wrapping at least one layer of metallic foil around the portion of the motor cable and the integrated circuit chip of the sensor may include, for example, wrapping a plurality of layer of metallic foil around the portion of the motor cable and the integrated circuit chip of the sensor.

In some embodiments, the method may include displaying the accumulated amount of time of operation of the motor on a display of the counter. For example, displaying the accumulated amount of time of operation of the motor on the display may occur in response to a button of the counter being pressed. The accumulated amount of time of operation of the motor may cease to be displayed on the display a threshold amount of time after the button of the counter is pressed. The method may also include inserting batteries into the counter to electrically power the counter and the sensor.

According to this disclosure, the method may further include calibrating the sensor using the counter. For example, calibrating the sensor may comprise pressing a button of the counter for a first threshold amount of time while the motor of the motor unit may not be operating. Alternatively or additionally, calibrating the sensor may comprise pressing the button of the counter for a second threshold amount of time while the motor of the motor unit may be operating. The first threshold amount of time may be reached when a message is displayed on a display of the counter indicating that zero current calibration has occurred. The second threshold amount of time may be reached when a message is displayed on a display of the counter indicating that a maximum cable current signature has been reached.

In some embodiments, the method may include estimating with the sensor an amount of current by detecting a strength of a force field in the motor cable. For example, estimating the amount of current may include amplifying and processing the detected force field. The method may further include displaying on a display of the counter information relating to one or more of the following: battery status; overload; counts of cycles; operation time; statistics during time intervals selected from at least one of day, month, and year; load or weight of patient, or service demand or necessity. In some embodiments, the method includes receiving power for the counter and sensor from an external DC power source.

According to this disclosure, the method may further include transmitting wireless data from the counter to one or more of the following: a handheld display, a hand control, or a network of a healthcare facility. The method may also include receiving at the counter wirelessly transmitted data from other devices for display or retransmission. Alternatively or additionally, the method may include coupling an additional cable extending from the counter to an output of a control box of the motor unit to receive data therefrom.

In some embodiments, wrapping the at least one layer of metallic foil around the portion of the motor cable and the integrated circuit chip of the sensor may include causing apertures in the at least one layer of foil to receive a coupling boss of a base of the sensor housing so that the coupling boss may extend through the at least one layer of metallic foil to permit attachment of the cover to base with a fastener. In some embodiments, the sensor includes a circuit board that may include an opening through which the coupling boss of the base of the sensor housing may project.

Additional features, which alone or in combination with any other feature(s), such as those listed above and those listed in the claims, may comprise patentable subject matter and will become apparent to those skilled in the art upon consideration of the following detailed description of various embodiments exemplifying the best mode of carrying out the embodiments as presently perceived.

BRIEF DESCRIPTION OF THE DRAWINGS

The detailed description particularly refers to the accompanying figures in which.

DETAILED DESCRIPTION

In the description that follows, a motor operation time counter apparatus 10, shown in FIGS. 1-23, is used with a patient mobile lift 100 having a motor unit 102, such as a linear actuator, portions of which are shown in FIGS. 15 and 19-22. Mobile lift 100 may include any of those available from Liko AB, for example. However, it is within the scope of the present disclosure for apparatus to be used in other systems having motor units with electric motors such as hospital beds, motorized chairs, surgical tables, manufacturing equipment, industrial equipment, construction equipment, aircraft, automobiles, and automated building equipment, just to name a few examples.

Figure 1:
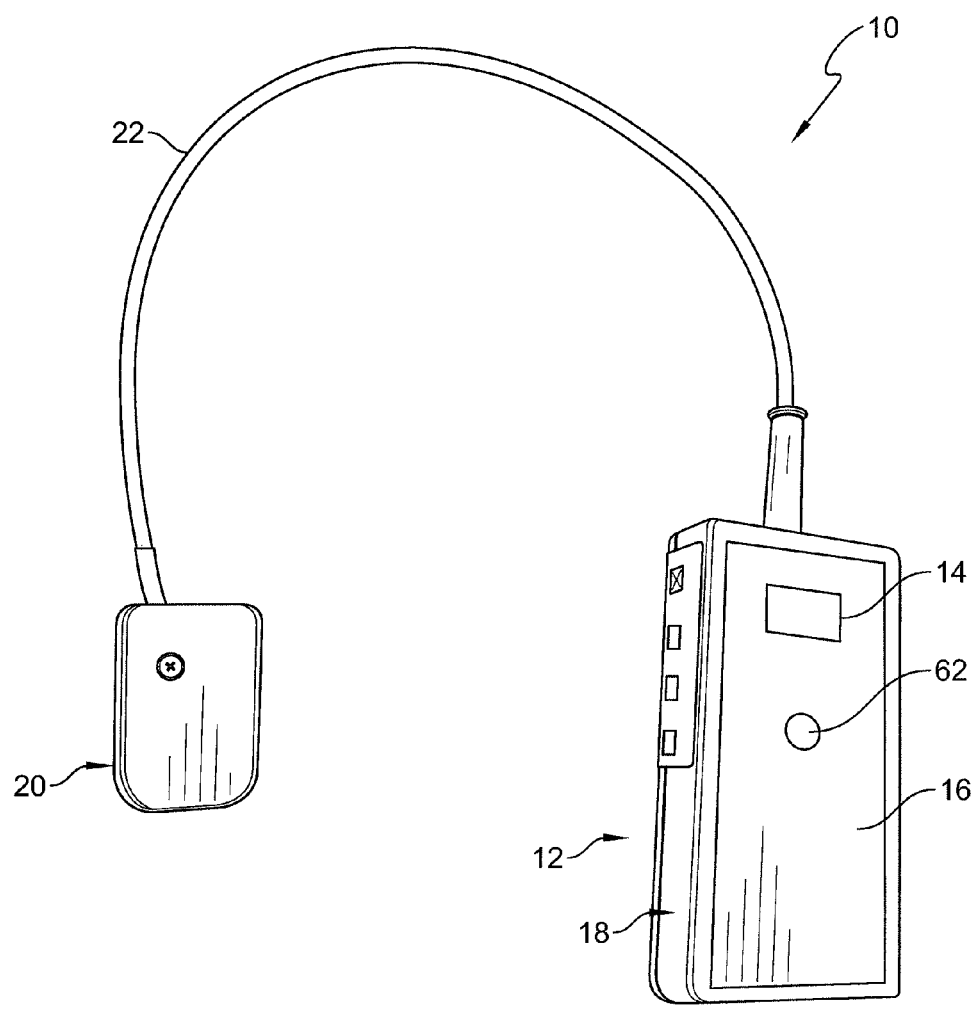
FIG. 1 is a perspective view showing a motor operation time counter apparatus including a counter having a display on a front wall of a box-shaped housing, a sensor housing to the left of the counter, and a cable interconnecting the counter and the sensor housing.

Referring now to FIG. 1, motor operation time counter apparatus 10 includes a counter 12 that, in turn, has a display 14 on a front wall 16 of a box-shaped housing 18. Apparatus also includes a sensor housing 20 and a cable 22 that interconnects the counter and the sensor housing or, more particularly, that interconnects the circuitry contained in housing 18 with the circuitry contained in housing 20. In the illustrative example, counter 12 is a product type NICS-01 unit with product number 2006040, which is available from Our Energy AB of Sundsvall, Sweden.

Figure 2:
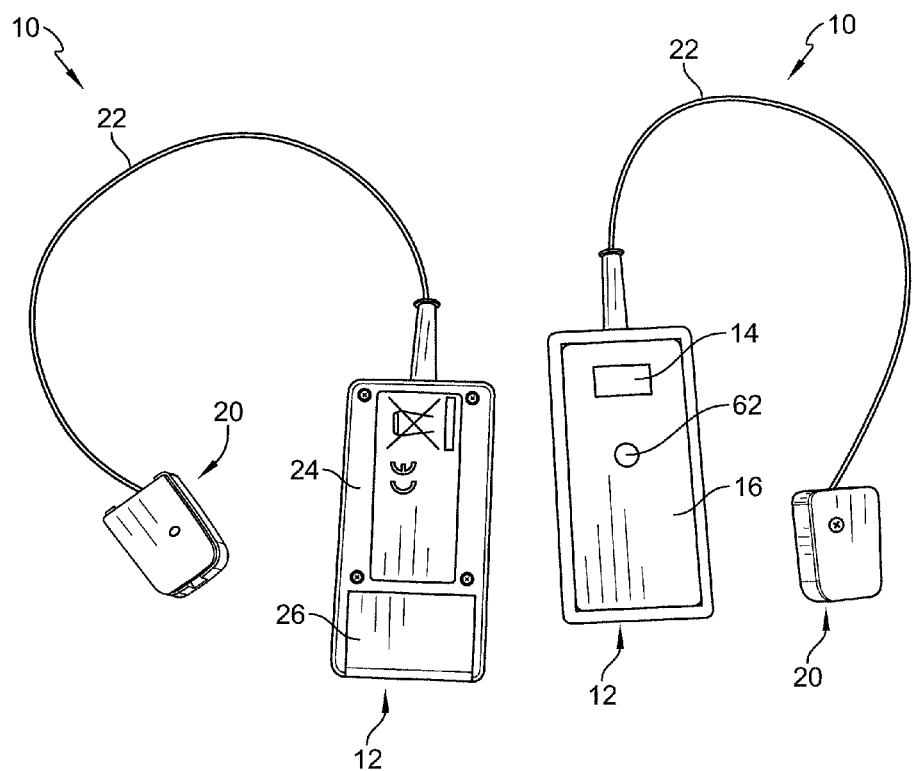
FIG. 2 is a perspective view showing two motor operation time counter apparatuses with a front of the respective counter and sensor housing being visible for one of the apparatuses and a back of the respective counter and sensor housing being visible for the other of the apparatuses.

Referring now to FIG. 2, two motor operation time counter apparatuses 10 are shown with a front of the respective counter and sensor housing 12, 20 being visible for the apparatus 10 on the right in FIG. 2 and a back of the respective counter and sensor housing 12, 20 being visible for the apparatus 10 on the left. Thus, a back wall 24 and a battery door or cover 26 can be seen in FIG. 2 for the left apparatus 10. Sensor housing 20 is sometimes referred to herein as just "sensor 20" but it should be appreciated that a sensor is actually contained inside of housing 20 as will be discussed in further detail below.

Figure 3:
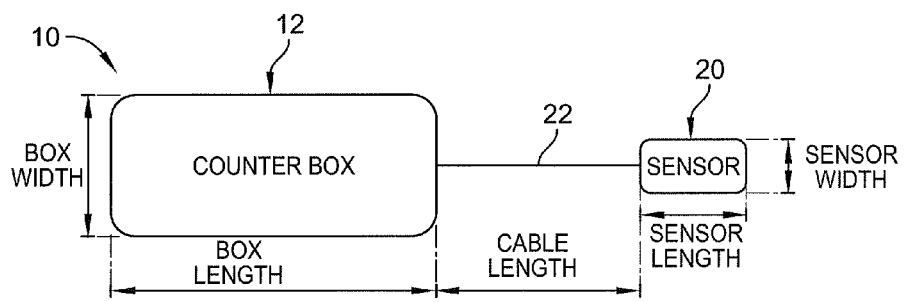
FIG. 3 is a diagrammatic view of the apparatuses of FIGS. 1 and 2 with dimension labels being shown for each of the components of the apparatuses.

Referring now to FIG. 3, a diagrammatic view apparatus 10 is provided with dimension labels for each of the components 12, 20, 22 of apparatus 10. In the illustrative example, counter box or housing 12 has a box length of about 130 millimeters (mm), a box width of about 65 mm, and a height (i.e., direction into the page in FIG. 3) of about 25.5 mm. The material from which housing 12 is constructed comprises Acetyl-Butyl-Styrene (ABS) in the illustrative example. Also in the illustrative example, the length of cable 22 between housings 12, 20 is about 400 mm. Furthermore, sensor length is about 49 mm, sensor width is about 33 mm, and sensor height (i.e., direction into the page in FIG. 3) is about 16.7 mm. Sensor housing 20 is also constructed of ABS in the illustrative example.

Figure 4:
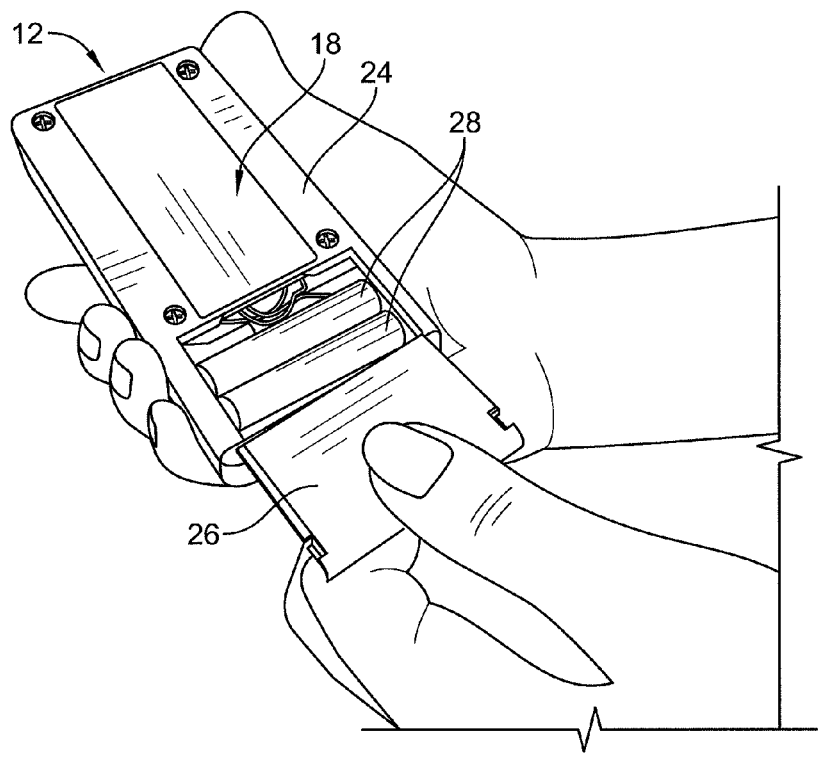
FIG. 4 is a perspective view showing a battery door being opened at the rear of the box-shaped housing of the counter to provide access to a battery compartment.

Referring now to FIGS. 4-21, the steps involved in retrofitting mobile lift 100 with apparatus 10 and calibrating apparatus 10 prior to use are shown. As shown in FIG. 4, battery door 26 of counter 12 is opened relative to back wall 24 of box-shaped housing 18 of counter 12 to provide access to a battery compartment. Two replaceable AA 1.5 Volt (V) batteries 28 are used to power apparatus 10 in the illustrative example. After batteries 28 are inserted into the battery compartment of housing 18 of counter 12, battery door 26 is moved back to the closed position.

Figure 5:
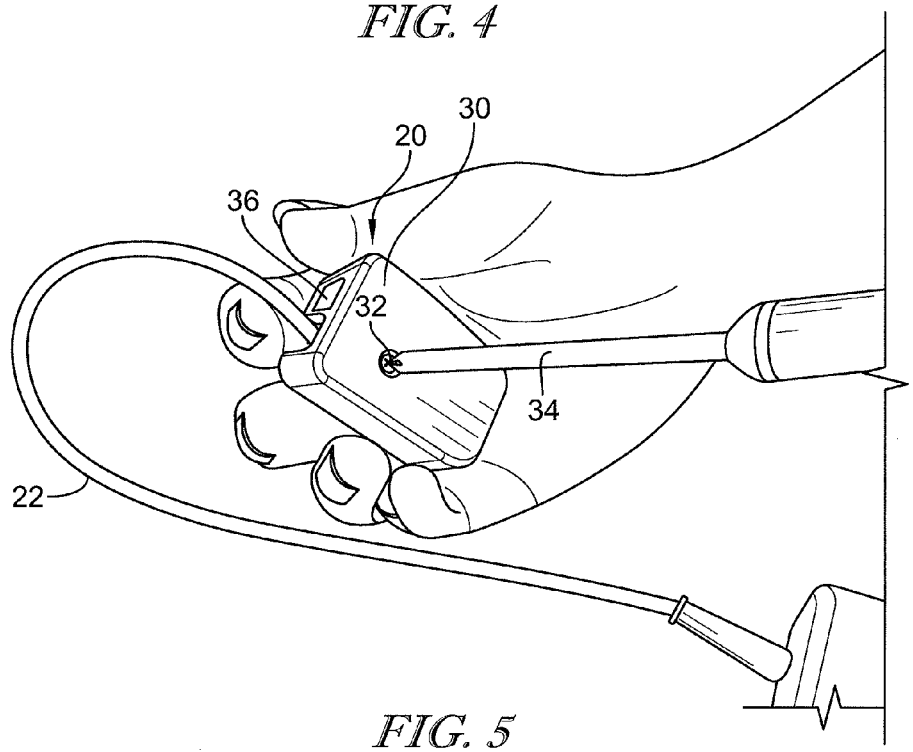
FIG. 5 is a perspective view showing a cover of the sensor housing being opened relative to a base of the sensor housing with a screwdriver that is turning a screw.

Referring now to FIG. 5, a cover 30 of sensor housing 20 is opened relative to a base 36 of the sensor housing 20 by loosening a screw 32 with a screwdriver 34. After screw 32 is detached from housing 20, cover 30 is able to be completely removed from base 36 in the illustrative example. In other embodiments, cover 30 is hinged to base 36, such as with a living hinge that is integrally molded with cover 30 and base 36.

Figure 6:
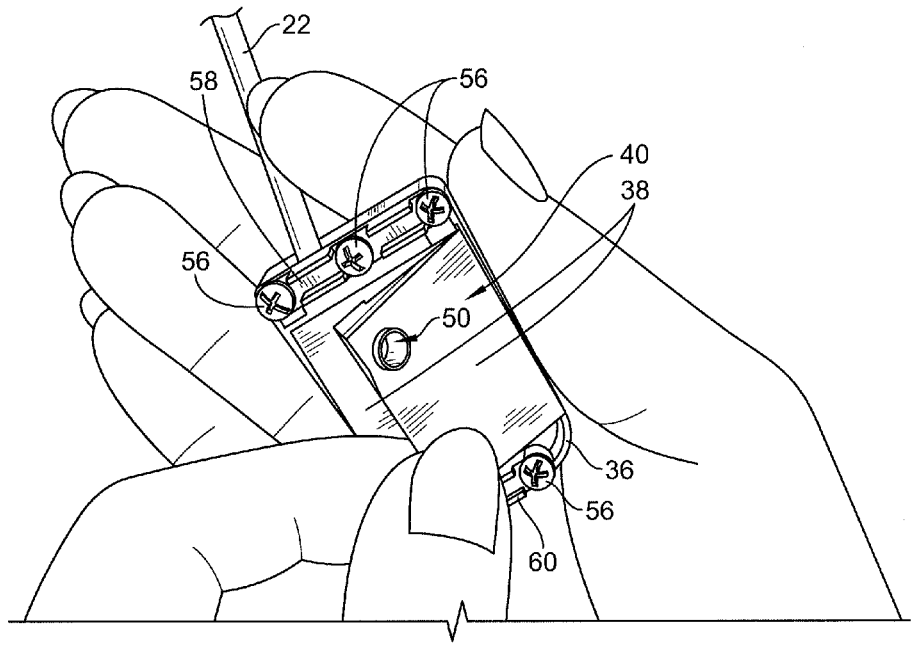
FIG. 6 is a perspective view after the cover of the sensor housing has been opened and removed from the base and showing a user beginning to unwrap layers of metallic foil of a sensor that is situated in an interior region of the sensor housing.
Figure 7A:
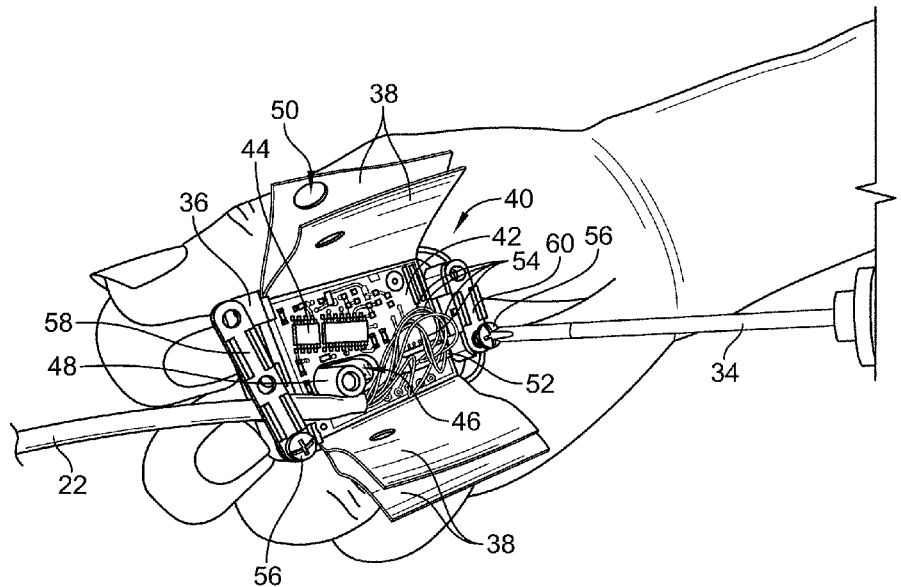
FIG. 7A is a perspective view, similar to FIG. 6, showing the foil layers being unwrapped sufficiently to expose a circuit board of the sensor that carries an integrated circuit chip thereon and showing a coupling boss of the sensor housing projecting through an opening in the circuit board.

As shown in FIG. 6, after cover 30 of sensor housing 20 has been opened and removed from base 36, a set of four metallic foil layers 38 of a sensor 40 that is situated in an interior region of the sensor housing 20 are unwrapped. As shown in FIG. 7A, after the foil layers 38 have been unwrapped sufficiently, a circuit board 42 of the sensor 40 is exposed. Circuit board 42 carries an integrated circuit (IC) chip 44 of sensor 40 thereon. IC chip 44 is a capacitive Hall Effect current sensor in the illustrative example. Chip 44 cooperates with foil layers 38 to sense current flowing in a motor cable 104 of motor unit 102 to which sensor 20 is attached as will be explained in further detail below.

Circuit board 42 includes an opening 46, shown best in FIG. 7A, and base 36 has a coupling boss 48 that projects through opening 46. Each of foil layers 38 is provided with an aperture 50 through which boss 48 projects when layers 38 are in their fully wrapped configuration around circuit board 46 and, if present, around motor cable 104 within the interior region of sensor housing 20. Screw 32 extends through an aperture in cover 30 and threads into boss 48 to attach cover 30 to base 36 thereby to form sensor housing 20.

Figure 7B:
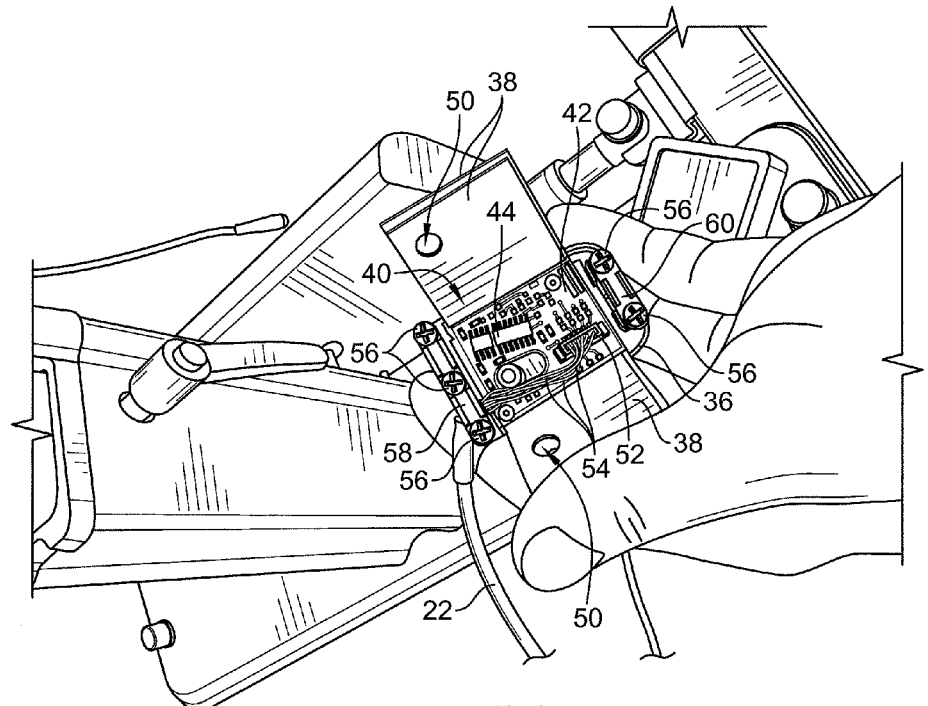
FIG. 7B is a perspective view similar to FIG. 7A but showing, more clearly, a connector on the circuit board of the sensor to which conductors of the cable attach.
Figure 8A:
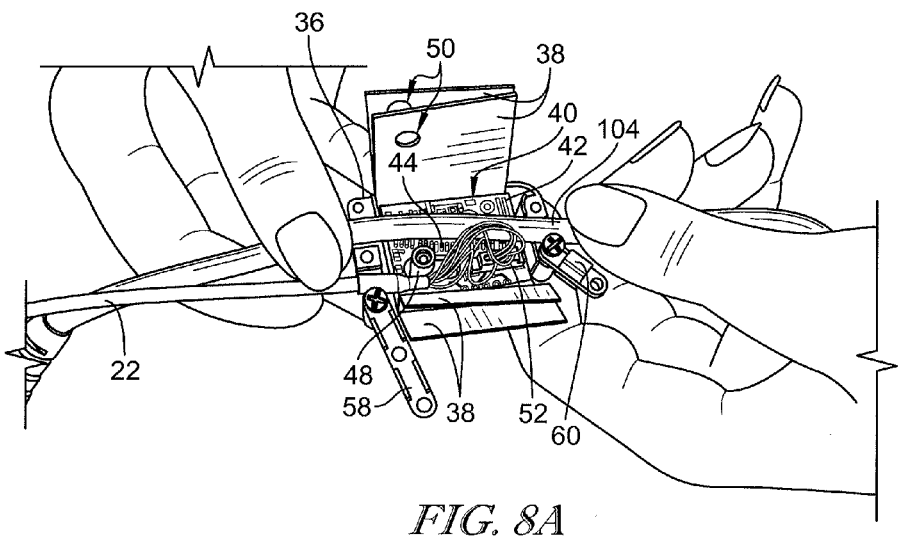
FIG. 8A is a perspective view showing a motor cable of a motor unit being routed through the sensor housing so that a portion of the motor cable is received in the interior region of the housing adjacent to the integrated circuit chip on the circuit board.

Circuit board 42 also carries an electrical connector 52 to which electrical conductors or wires 54 of cable 22 attach as shown in FIGS. 7A and 7B. A set of fasteners 56, such as illustrative screws, attach a first strain relief 58 and a second strain relief 60 to base 36 of housing 20. As shown best in FIG. 7B, three fasteners 56 are used to couple first strain relief 58 to a first end of base 36, whereas two fasteners 56 are used to couple second strain relief 60 to a second end of base 36. Fasteners 56 are removed or loosened with screwdriver 34, as shown in FIG. 7A, to permit strain reliefs to 58, 60 to be moved to opened positions extending away from base 36 as shown in FIG. 8A. In the illustrative example, one fastener 56 for each respective strain relief 58, 60 is simply loosened sufficiently to permit movement of the strain reliefs to the opened positions from the closed positions.

Figure 8B:
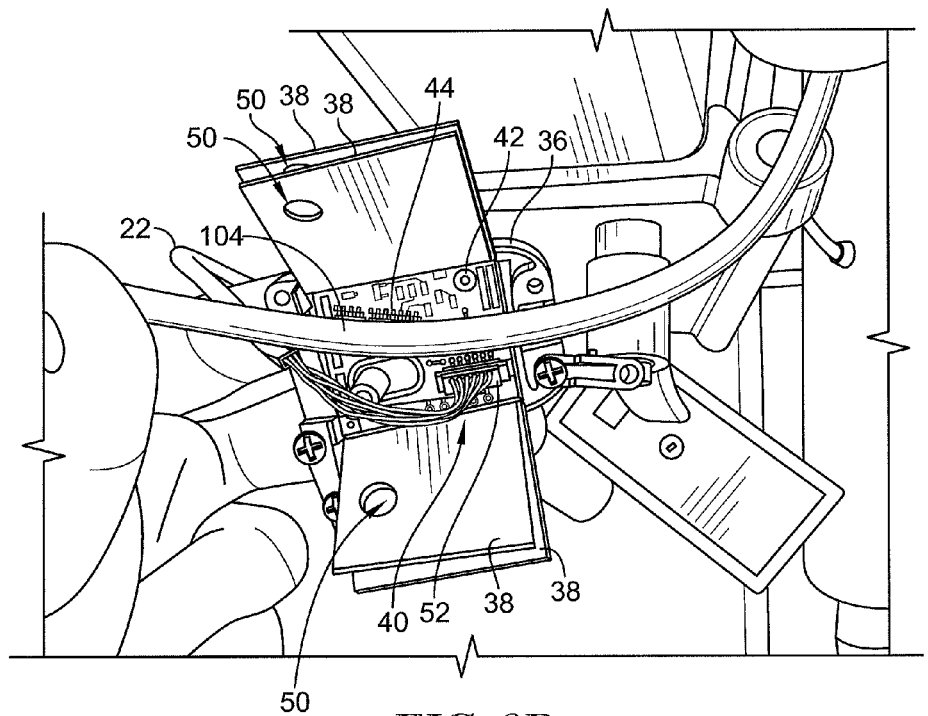
FIG. 8B is a perspective view similar to FIG. 8A.

As shown in FIGS. 8A and 8B, after strain reliefs 58, 60 are moved to the opened positions, motor cable 104 of motor unit 102 is routed through the base 36 of sensor housing 20 so that a portion of the motor cable 104 is received in the interior region of the housing 20 adjacent to IC chip 44 on circuit board 42. In the illustrative example, motor cable 104 is placed so as to abut or rest upon a top surface of IC chip 44. In FIGS. 7A, 7B, 8A and 8B, it can be seen that each of metallic foil layers 38 include a non-metallic backing. The non-metallic backing insures that the metallic foil of each of layers 38 does not electrically contact or short out against any of the other metallic foil of layers 38.

First strain relief 58 engages and retains motor cable and cable 22 of apparatus 10 relative to the first end of housing 20, whereas strain relief 60 engages and retains motor cable 104 relative to the second end of housing 20. Thus, base 36 has two notches at its first end to accommodate the two cables 22, 104 whereas base 36 has only one notch at its second end to accommodate cable 104. Strain relief 58 bridges over both notches and cables 22, 104 at the first end of housing 20 and so is longer than strain relief 60 which bridges over only one notch and cable 104 at the second end of housing 20.

Figure 9:
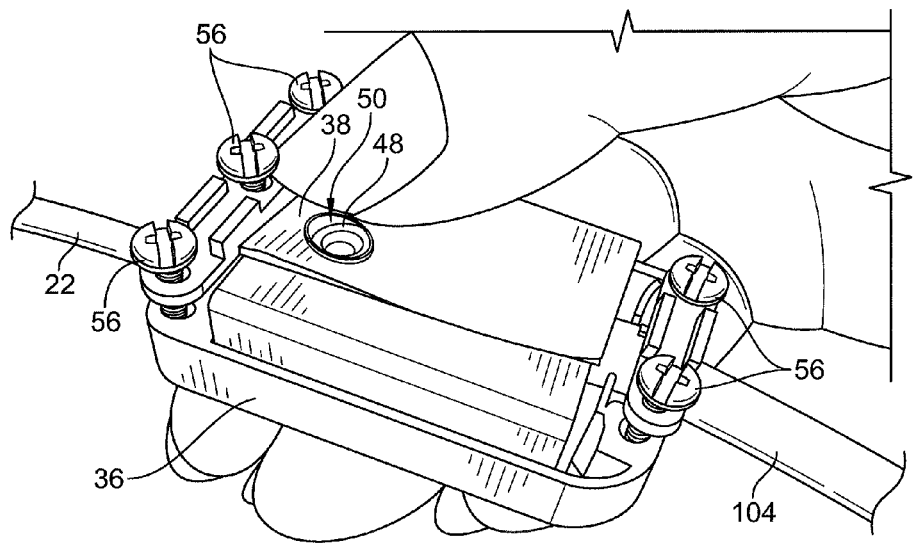
FIG. 9 is a perspective view showing first and second strain reliefs moved to positions to retain the motor cable to the base of the sensor housing and showing the foil layers being wrapped back around the circuit board, the integrated circuit chip and a portion of the motor cable between the first and second strain reliefs.

As shown in FIG. 9, after first and second strain reliefs 58, 60 are moved to closed positions to loosely retain motor cable 104 relative to base 36 of the sensor housing 20. Thus, fasteners 56 are partially tightened so that base 36 and sensor 40 are able to be repositioned along motor cable 104 and rotated around motor cable 104 as desired during the calibration process that is discussed in further detail below. As also shown in FIG. 9, foil layers 38 are wrapped back around the circuit board 42, the IC chip 44 and the portion of motor cable 104 between the first and second reliefs 58, 60. In FIG. 9, the top of boss 48 can be seen through the aperture 50 of the top foil layer 38.

Figure 10:
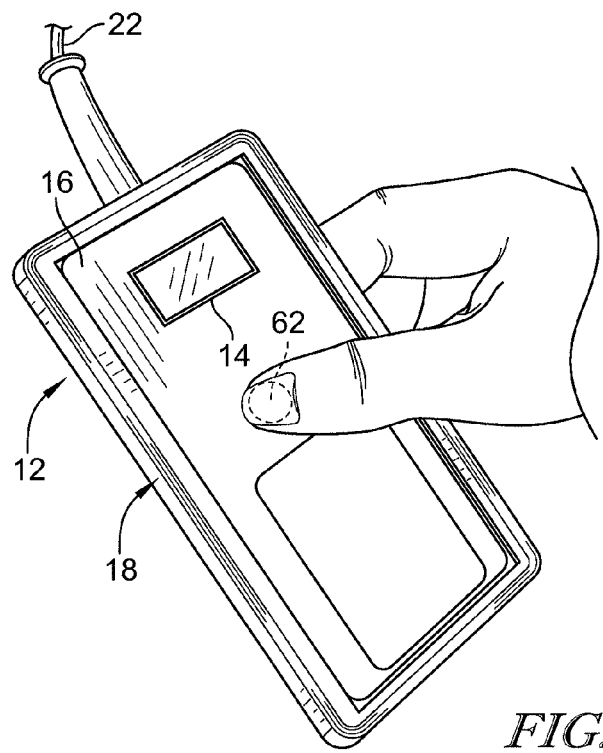
FIG. 10 is a perspective view showing a button of the counter being pressed to initiate a zero current calibration procedure when a motor of the motor unit is not being operated.
Figure 11:
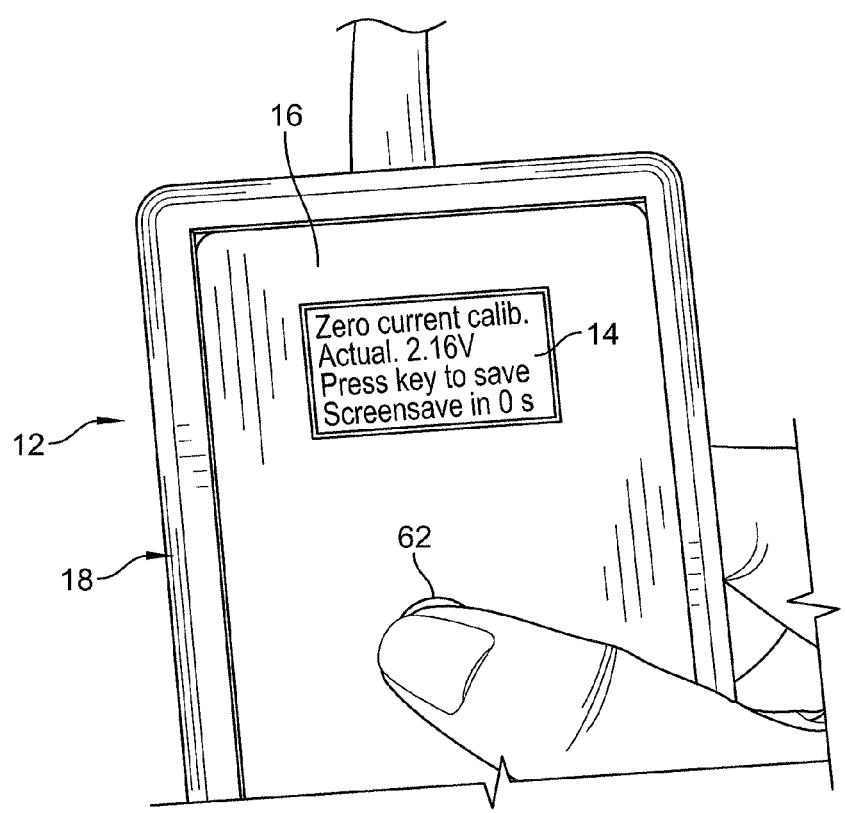
FIG. 11 is a front elevation view of a portion of the counter showing information that appears on the display when a zero current calibration process has been completed.

Referring now to FIG. 10, a button 62 of counter 12 is pressed by a user to initiate a zero current calibration procedure. In the illustrative example, button 62 has the text "OK" therein. During the zero current calibration procedure, a motor of the motor unit 102 is not operated. To reach the zero current calibration procedure, button 62 must be continuously pressed for a threshold amount of time, such as on the order of about five seconds in the illustrative example. After display 14 displays a message that states "Zero current calib." as shown in FIG. 11, the button 62 is released for a threshold amount of time, such as on the order of about four seconds in the illustrative example. A countdown timer is provided so that the user knows when the zero current calibration procedure has been completed. In the illustrative example, the countdown timer appears next to the text "Screensave in #s" where the countdown in seconds appears in the place of the # symbol. After the countdown timer reaches zero seconds, the user presses button 62 to turn off display 14 at the end of the zero current calibration process as shown in FIG. 12.

Figure 12:
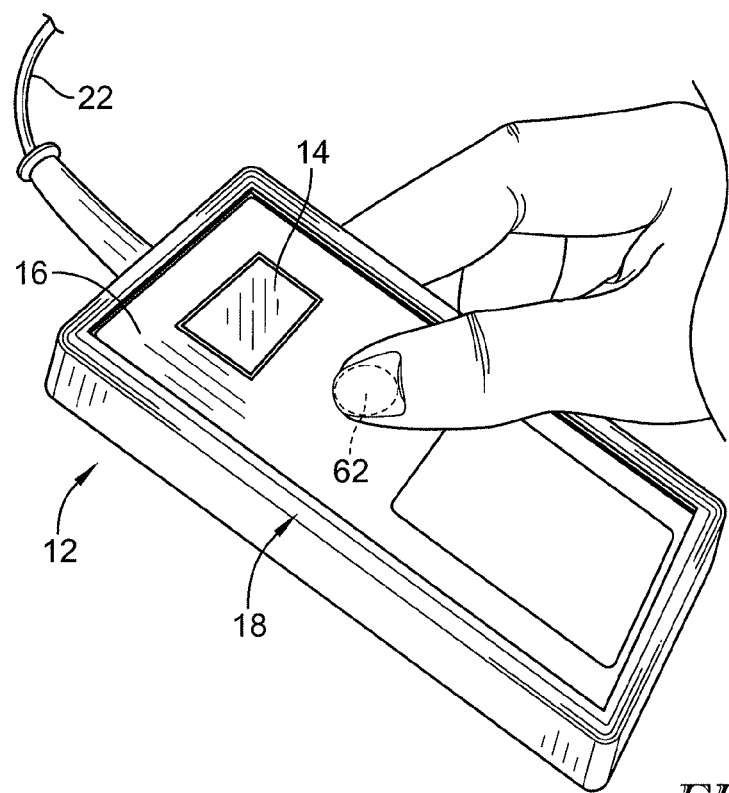
FIG. 12 is a perspective view of the counter showing the button being pressed to turn off the display at the end of the zero calibration process.
Figure 13:
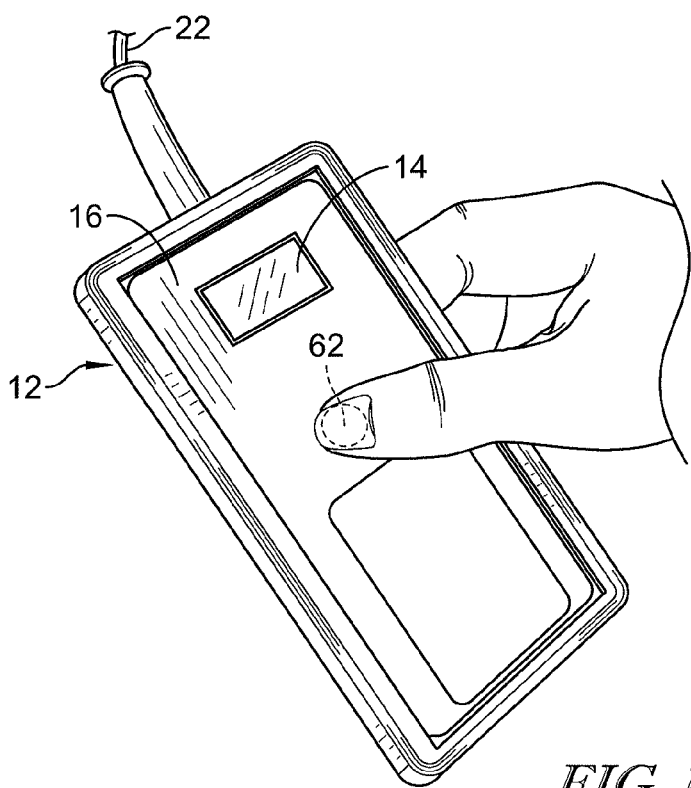
FIG. 13 is a perspective view showing the button of the counter being pressed to initiate a current calibration procedure when a motor of the motor unit is going to be operated.
Figure 14:
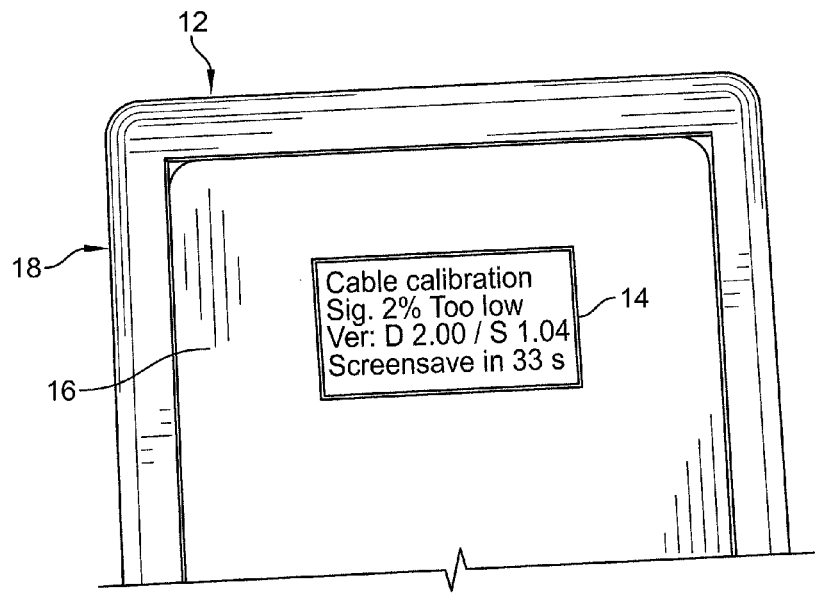
FIG. 14 is a front elevation view of a portion of the counter showing information that appears on the display prior to the motor being operated but indicating that the cable or current calibration mode has been initiated.
Figure 15:
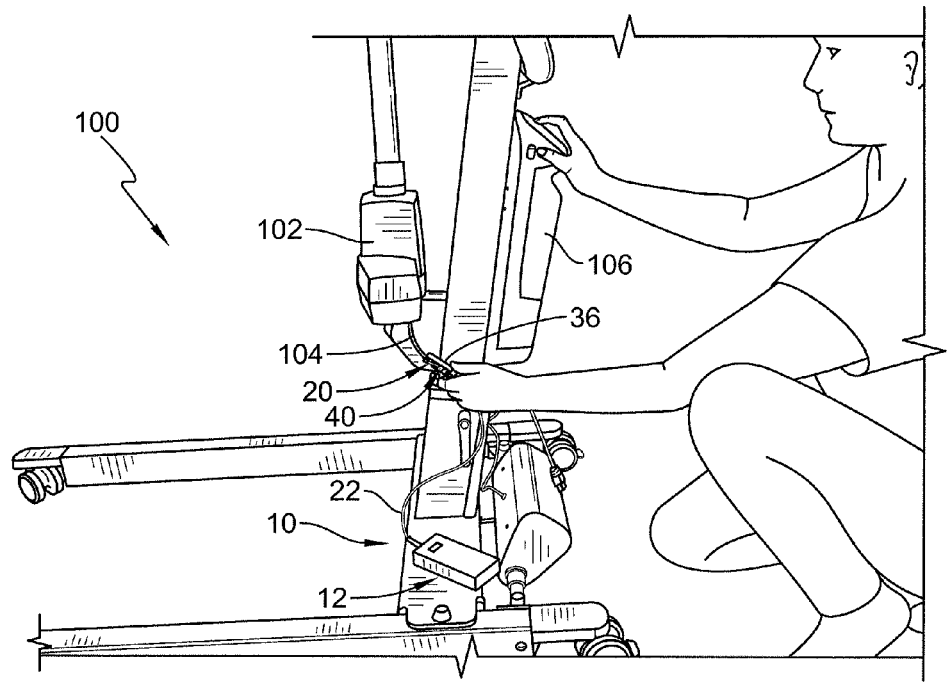
FIG. 15 is a perspective view showing a user providing an input to the control unit of a motor unit of a patient lift to operate a motor of a linear actuator of the lift while holding the sensor housing in place on the motor cable.

After thee zero current calibration procedure of FIGS. 10-12, button 62 of counter 12 is pressed to initiate a current calibration procedure as shown in FIG. 13. During the current calibration procedure, a motor of motor unit 102 is operated such as with a user input of a motor control unit 106 of motor unit 102 as suggested in FIG. 15. To reach the current calibration procedure, button 62 must be continuously pressed for a threshold amount of time, such as on the order of about five seconds in the illustrative example. After display 14 displays a message that states "Cable calibration" as shown in FIG. 14, the button 62 is released. At that point, the display 14 displays a countdown timer during which the user operates the motor unit 102 and manipulates sensor 40 and base 36 along motor cable 104 as shown in FIG. 15. In the illustrative example, the countdown timer appears next to the text "Screensave in #s" where the countdown in seconds appears in the place of the # symbol.

Figure 16:
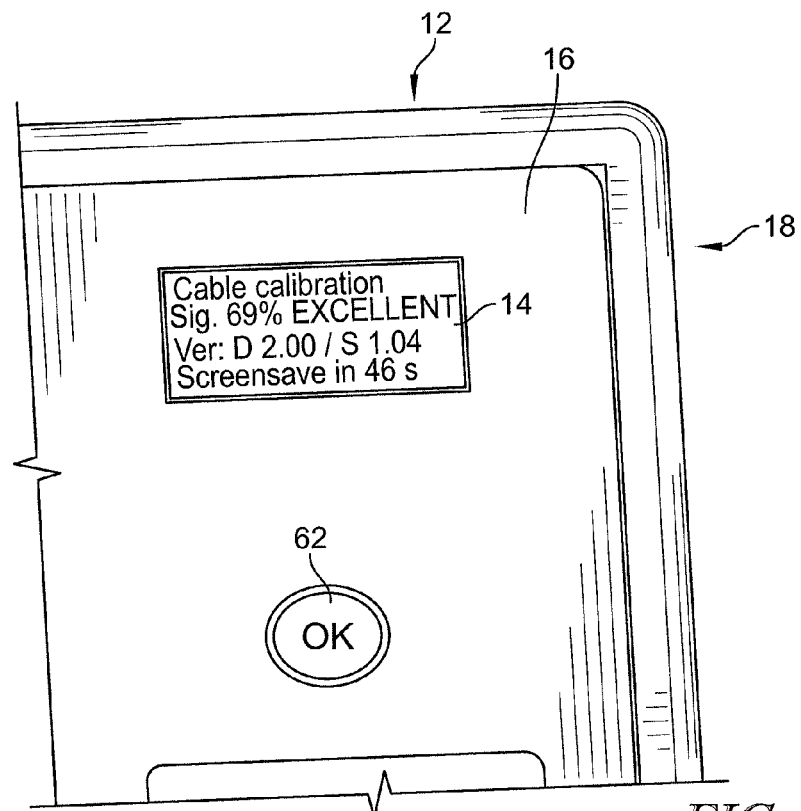
FIG. 16 is a front elevation view of the counter showing a message indicating that a successful cable calibration has been achieved.

In FIG. 14, the countdown timer is shown to be at 33 seconds and in FIG. 16, the countdown timer is shown to be at 46 seconds. Thus, during the current calibration procedure, there is a fairly long period of time for the user to operate motor unit 102 and manipulate sensor 40 and base 36 relative to cable 104 by rotation about, or movement along, cable 104. While operating the motor unit 102 of the illustrative mobile patient lift 100, there should be no load (e.g., a patient) on the lift. During manipulation of sensor 40 and base 36 relative to cable 104, the user observes the "Sig." (aka signature) reading on display 14.

Once the "Sig." reading is at 40% or above, the sensor 30 and base 36 are in a suitable position relative to cable 104 for proper operation of apparatus 10. In FIG. 14, display 14 includes the text "Sig. 2% Too low" which, in the illustrative example, indicates that the sensor 40 and base 36 are not in a suitable position, whereas in FIG. 16, display 16 includes the text "Sig. 69% EXCELLENT" which, in the illustrative example, indicates that the sensor 40 and base 36 are in a suitable position. It is preferable for the user to move sensor 40 and base 36 until the highest Sig. number is achieved, but any number that is 40% or above will suffice.

Figure 17:
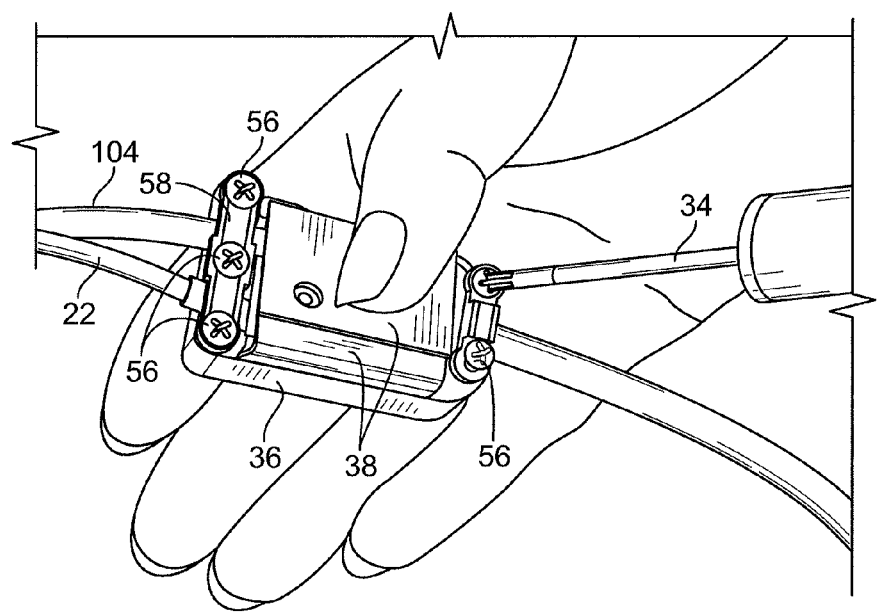
FIG. 17 is a perspective view showing the user tightening the first and second strain reliefs to lock the sensor housing in place on the motor cable of the motor unit.
Figure 18:
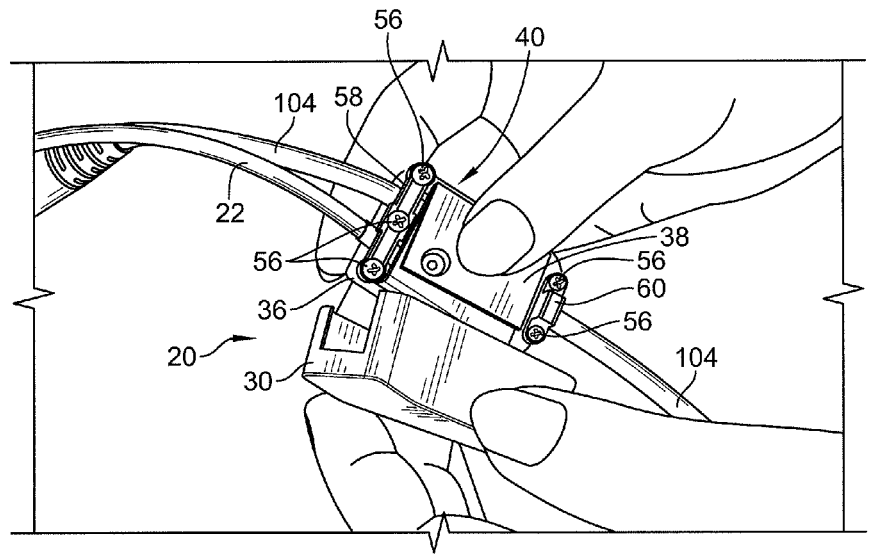
FIG. 18 is a perspective view showing the cover of the sensor housing being moved toward the base of the sensor housing for attachment thereto.

Referring now to FIG. 17, after a suitable Sig. number is reached during the current calibration procedure, the user tightens the five screws 56 with screwdriver 34 to clamp first and second strain reliefs 58, 60 against cables 22, 104 and to lock the base 36 of sensor housing 20 and sensor 40 in place on motor cable 104 of motor unit 102. As shown in FIG. 18, after screws 56 are tightened, cover 30 of sensor housing 20 is moved back over base 36 and sensor 40 and reattached to base 36 with screw 32 using screwdriver 34. Thus, the same size of screwdriver 34 can be used to loosen and tighten screw 32 and screws 56, thereby minimizing the amount of tools need to attach apparatus 10 to motor unit 102.

Figure 19:
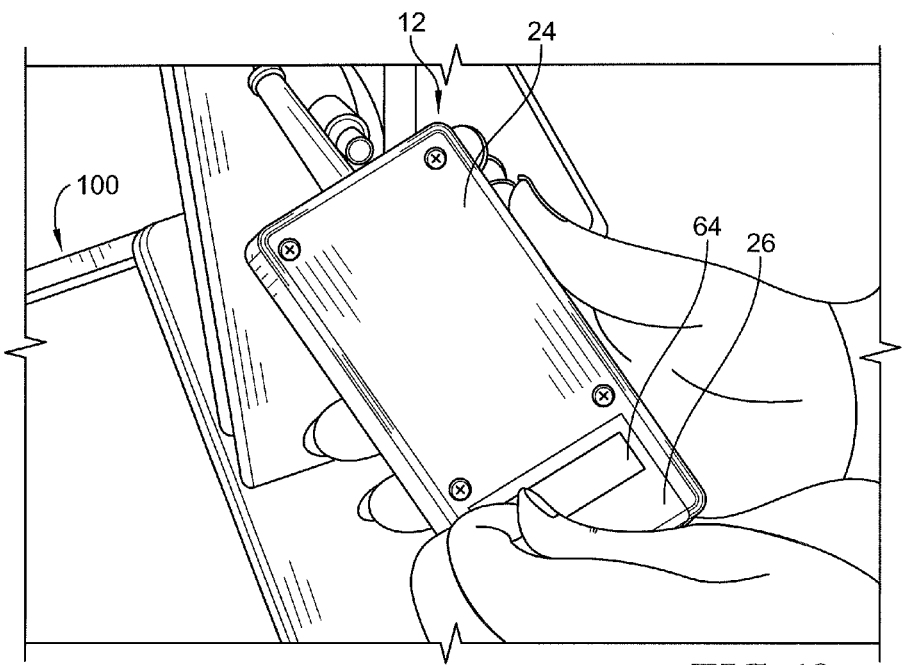
FIG. 19 is perspective view showing an adhesive patch or pad on the back of the housing of the counter.
Figure 20:
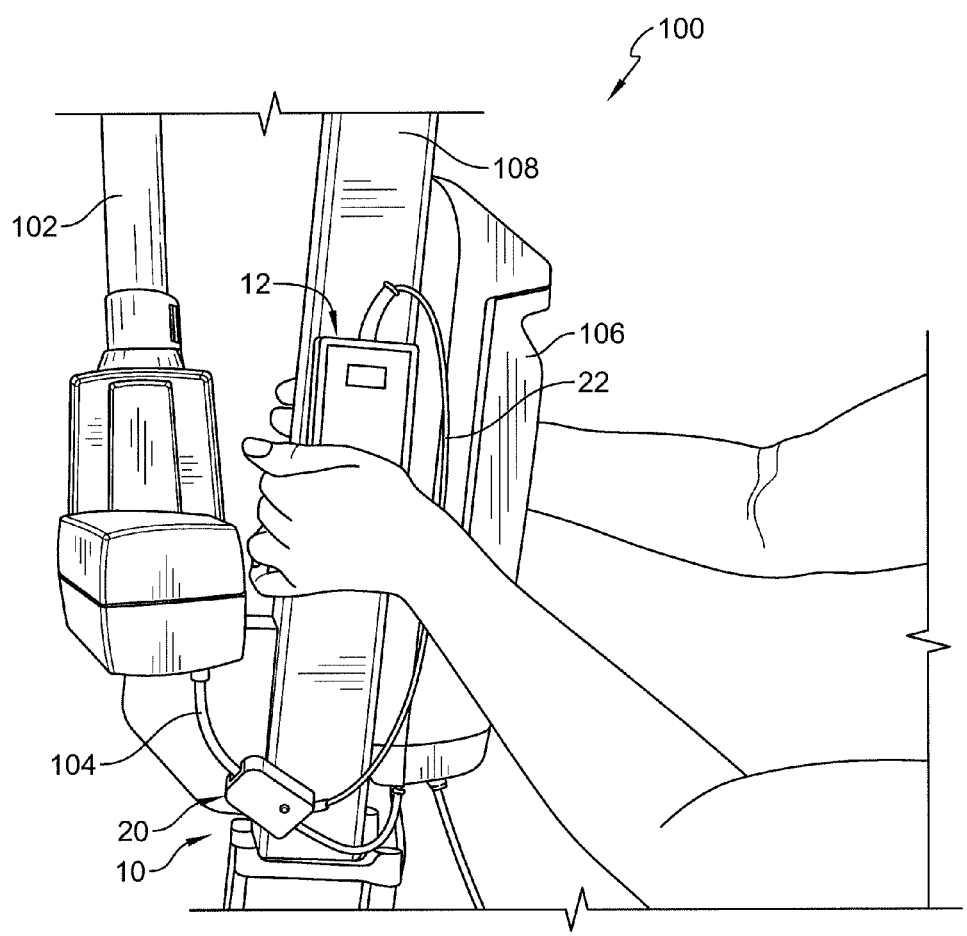
FIG. 20 is a perspective view showing the user attaching the counter to a structural member of the patient lift adjacent to, but spaced from, the linear actuator.
Figure 21:
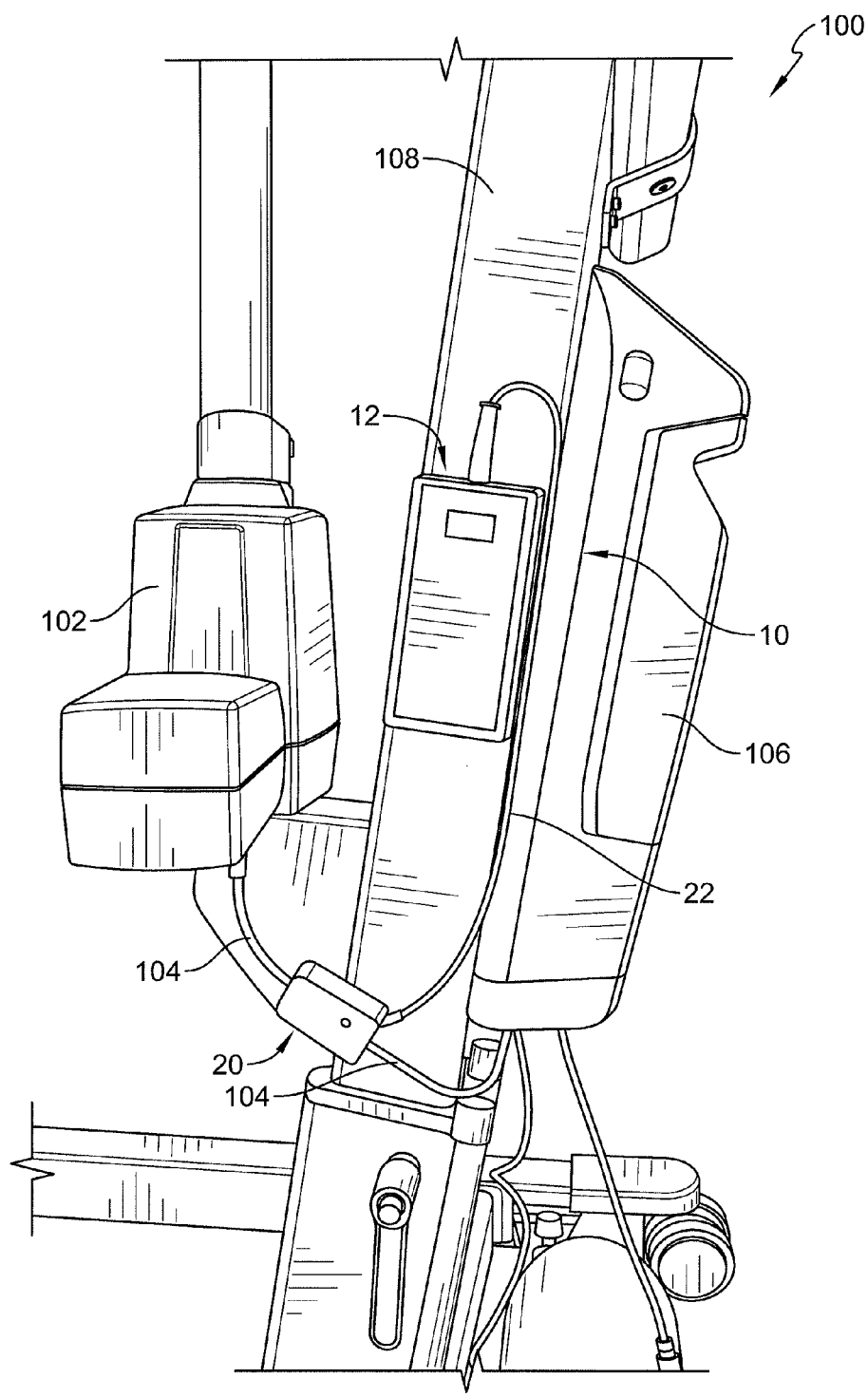
FIG. 21 is a perspective view showing the counter attached in place on the structural member of the patient lift.

Referring now to FIG. 19, an adhesive patch or pad 64 is attached to the back of the housing 18 of the counter 12. In the illustrative example, patch 64 is placed on battery door 26 but may just as well be placed on back wall 24 if desired. Once patch 64 is in place on counter 12, it can be stuck or adhered to any desired location of apparatus 100 as constrained by the length of cable 22. For example, a user is shown in FIG. 20 attaching counter 12 is to a structural member or mast 108 of the mobile patient lift 100 adjacent to, but spaced from, the linear actuator 102. As shown in FIG. 21, the counter 12 is held in place on mast 108 by the adhesive pad 64. In some embodiments, patch 64 comprises double sided tape. Other fasteners, such as screws, hook-and-loop fasteners, and the like are used to attach counter 12 to apparatus 100.

In use, sensor 40 in housing 20 senses the flow of current in motor cable 104 each time the motor of motor unit 102 is operated and provides a signal to counter 12 via cable 22. Counter 12 logs or keeps track of the accumulated amount of time, in minutes and seconds, that the motor of motor unit 102 is operated since the start of the counter 12 which occurs after the calibration process is complete. When button 62 is pressed, display 14 turns on and the total running time (e.g., in the format "minutes:seconds") is presented for a threshold amount of time, such as on the order of about ten seconds in the illustrative example, then the display 14 automatically turns off.

In the illustrative example, the current flow sensed by sensor 40 must exceed a threshold amount, such as about 400 milliamps (mA) in order for the counter 12 to add to the accumulated time. Thus, when the current in motor cable 104 is sensed by sensor 40 to be below about 400 mA, the time is not added to the accumulated total. Other current thresholds that are greater than or less than about 400 mA may be used, as desired, in other embodiments. By having a threshold current amount below which time is not accumulated, no load uses of motor unit 102 of apparatus 100 can be excluded from the accumulated time and only loaded conditions (e.g., a patient being carried by a mobile lift) of motor unit 102 are counted.

While AA batteries 28 are shown in the illustrative example, other types of batteries such as AAA batteries, C batteries, etc. may be used in other embodiments. It is contemplated that the batteries 28 used should have a life that exceeds one year and that can be changed or recharged by a service technician during a yearly periodic inspection of apparatus 100. It contemplated by this disclosure that, in some embodiments, there is no possibility of resetting the accumulated time. In such embodiments, the accumulated time may be stored and protected in an electrically programmable read only memory (EPROM). In some embodiments, display 14 is able to show up to 5 digits of run time allowing a maximum of 99999 minutes (i.e., 70 days of continuously running) to be presented on display 14.

Figure 22:
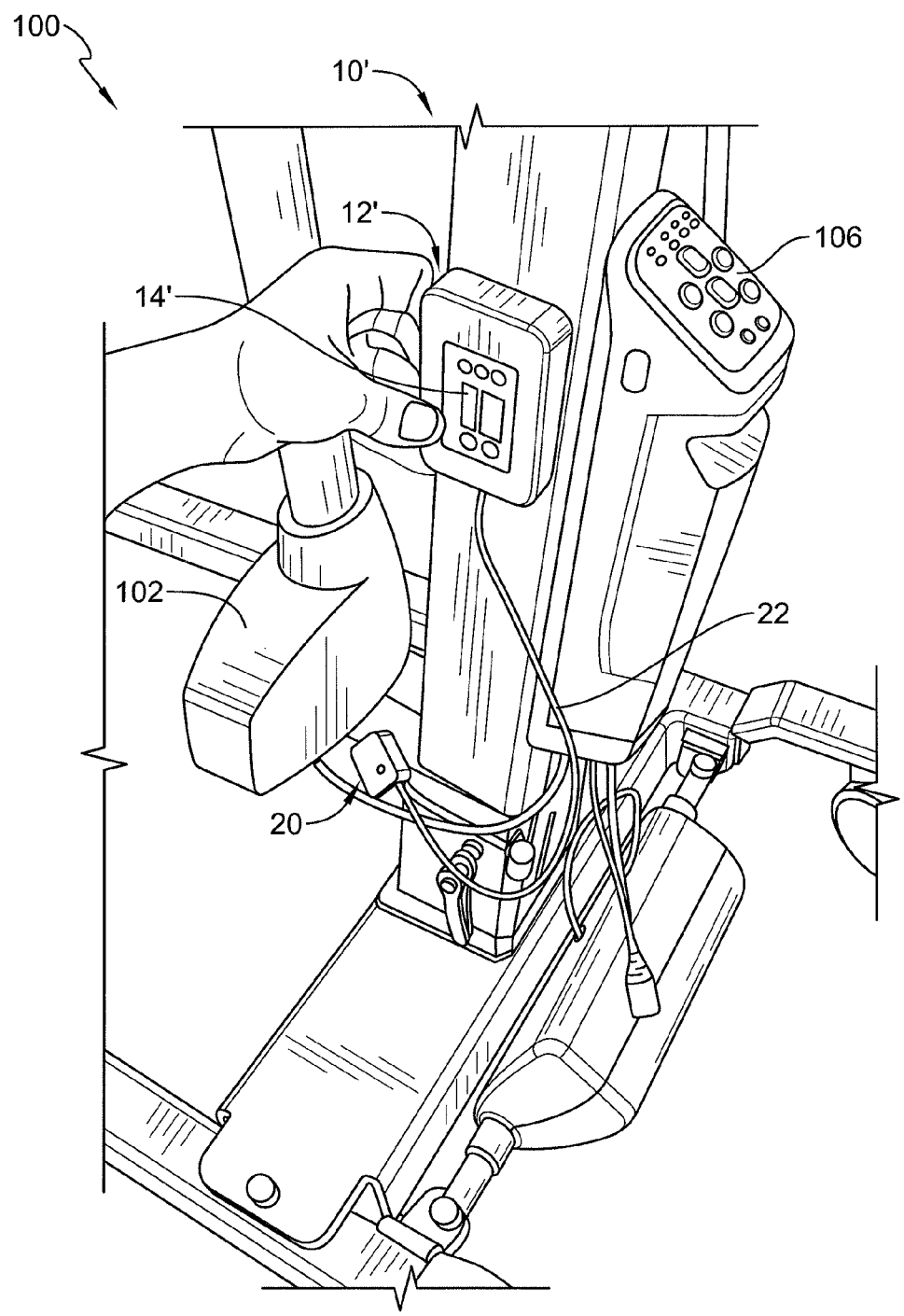
FIG. 22 is a perspective view showing an alternative embodiment of a counter that includes a graphical user interface comprising a touchscreen display.
Figure 23:
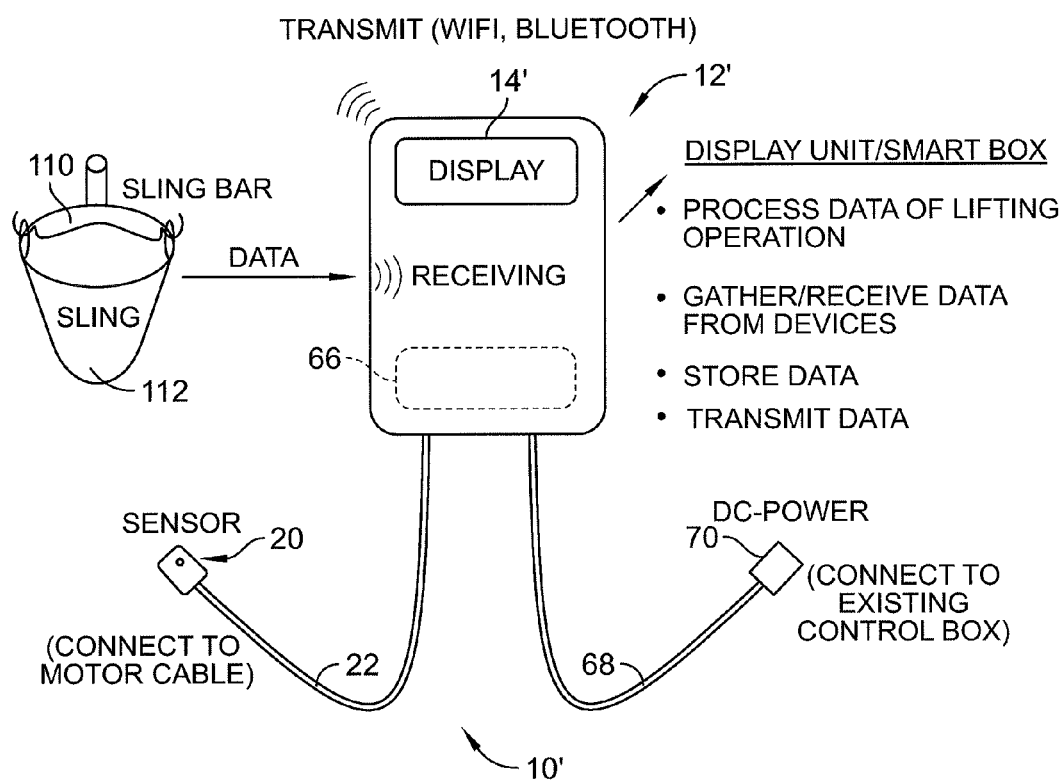
FIG. 23 is diagrammatic view showing wireless communication capability of the counter.

As shown in FIG. 22, the present disclosure contemplates an alternative motor operation time counter apparatus 10' that has an alternative counter 12' with a graphical user interface 14' that, in the illustrative example, comprises a touchscreen display. However, the discussion above regarding apparatus 10, counter 12 and display 14 is equally applicable to apparatus 10', counter 12' and display 14'. However, this disclosure contemplates that apparatus 10' has additional functionality as compared to apparatus 10. For example, as shown in FIG. 23, counter 12' is equipped with circuitry 66 that provides counter 12' with wireless communication capability.

In the illustrative example, wireless data transmitted by a sling bar 110 is received by circuitry 66 of counter 12'. For example, a patient (not shown) being carried by a sling 112 hanging from sling bar 110 may be weighed by an electronic scale that interconnects ling bar 112 and a lift arm (not shown) of apparatus 100 and the weight reading may be transmitted wirelessly to counter 12'. Circuitry 66 of counter 12' may similarly receive wireless data transmitted by other devices in a patient room. Circuitry 66 of counter 12', therefore, processes data of a lifting operation of apparatus 100 in some embodiments. Alternatively or additionally, circuitry 66 of counter 12' gathers or receives data from other devices and either stores the received data or wirelessly transmits the received data to a network of a healthcare facility or both for further processing and displaying. The wireless transmission from counter 12' may be made to a handheld display or hand control in addition to or in lieu of the transmission to the facility network. The wireless communication capability of counter 12' includes radio frequency (RF) technology such as Wi-Fi technology or Bluetooth technology, for example. Other potential wireless communication technologies that counter 12' may use in some embodiments include, infrared (IR) technology, ultrasound technology, ultra wideband technology, and the like.

Also in the illustrative example, counter 12' has a power cable 68 for providing power to apparatus 10 in lieu of or in addition to the use of batteries 28. Cable 68 terminates at an electrical connector 70 that is coupleable to an external source of power. For example, connector 70 is coupleable to a DC power port (not shown) of control unit 106 of motor unit 102 to receive DC power from control unit 106. The DC power provided to counter 12' from control unit 106 may be provided by a battery or battery pack of unit 106 in some embodiments.

It is contemplated by this disclosure that sensor 40 amplifies the detected current and either sensor 40 or circuitry 66 processes the amplified current to calculate a reasonable approximation of the actual current flowing in motor cable 104 (aka a calculated current). Based on the calculated current, circuitry 66 is able to determine a load being placed on motor unit 102 in some embodiments. Alternatively or additionally, circuitry 66 calculates one or more of the following: battery status, overload, counts or cycles, operation time, load of a patient, and service demand. Display 14' is operable to display these data points. Counters 12, 12' include a real time clock (RTC) in some embodiments. Counter 12' is able to wirelessly transmit or provide on display 14' statistics during time intervals selected from at least one of day, month, and year.

The apparatuses 10, 10' contemplated herein are "passive" devices in that they do not interfere with the existing mechatronics of the devices, such as apparatus 100, with which they are used. Apparatuses 10, 10' do not draw current from the motor units 102 with which they are used and thus, are non-electrically interfering. Accordingly, use of apparatuses 10, 10' does not require the apparatuses 100 or motor units 102 with which they are used to be recertified. The original certifications remain unaffected. Apparatuses 10, 10' are easily mounted to apparatuses 100 and easily calibrated. Apparatuses 10, 10' can be used with any motor units 102 having an accessible motor wire 104. Apparatuses 10, 10' can be used with medical devices and with nonmedical devices.

Figure 24:
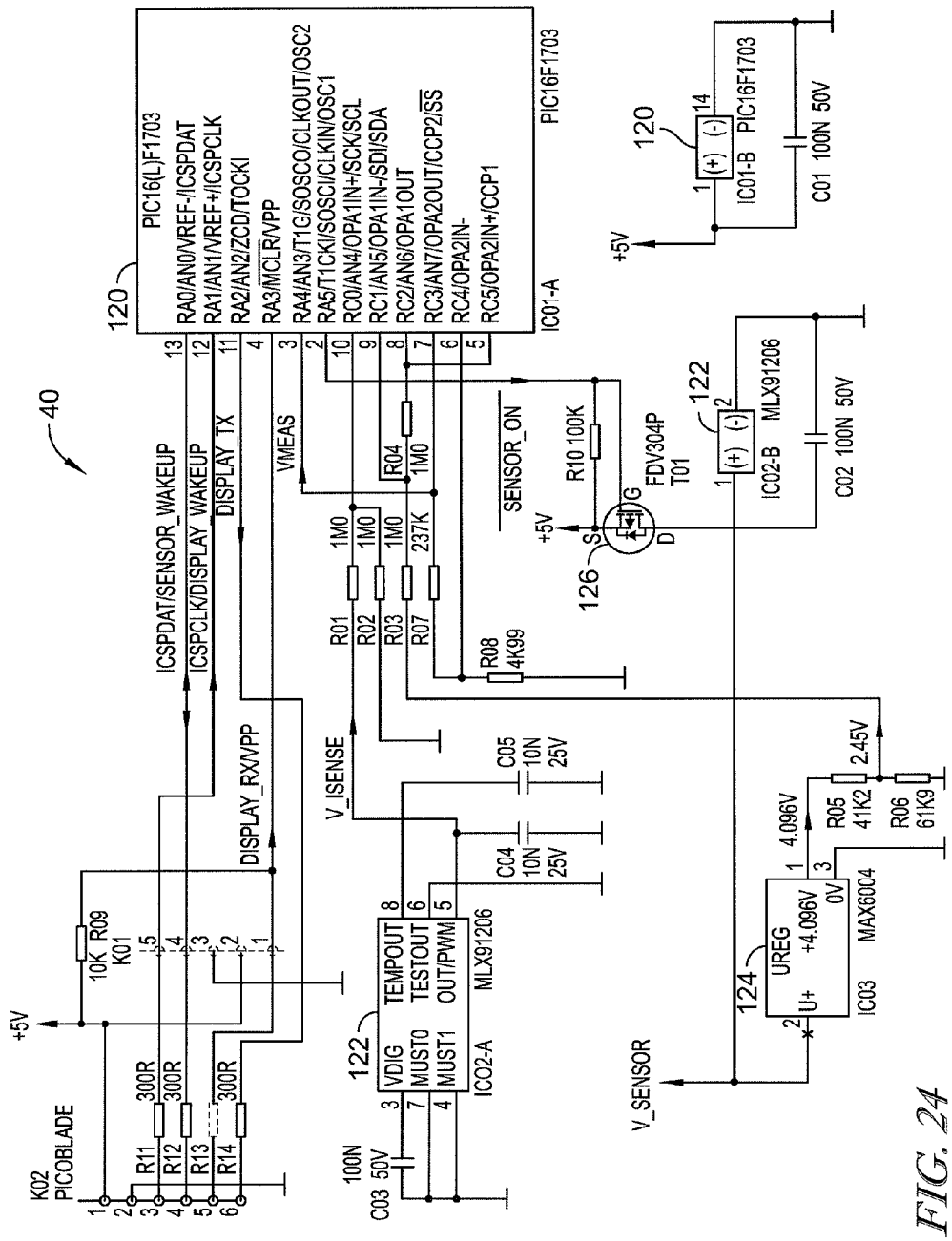
FIG. 24 is a circuit schematic of the circuitry of one embodiment of the sensor of FIGS. 1-3 and 5-9.

Referring now to FIG. 24, a circuit schematic of one embodiment of sensor 40 of FIGS. 1-3 and 5-9 is provided. Sensor 40 includes a microcontroller 120 which in the illustrative embodiment comprises a model no. PIC16(L) F1703 microcontroller which is a 14-pin 8-bit advanced analog flash microcontroller available from Microchip Technology Inc. of Chandler, Ariz. Pins 1 and 14 of microcontroller 120 are shown as part of a separate, smaller box in the circuit schematic of FIG. 24. Sensor 40 also includes a current sensor chip 122 which in the illustrative embodiment comprises a model no. MLX91206 Hall Effect current sensor available from NV Melexis SA of Ieper, Belgium. Pins 1 and 2 of current sensor 122 are shown as part of a separate, smaller box in the circuit schematic of FIG. 24. Sensor 40 further includes a voltage reference 124 which in the illustrative embodiment comprises a model no. MAX6004 voltage reference available from Maxim Integrated Products of Sunnyvale, Calif. Sensor 40 further includes a field effect transistor (FET) 126 which in the illustrative example comprises a model no. FDV304P P-channel enhancement mode digital FET available from Fairchild Semiconductor Corp. of San Jose, Calif. The other circuit elements of sensor 40 comprise standard connectors, resistors, and capacitors having, for example, the resistance and capacitance values indicated in FIG. 24.

Figure 25A:
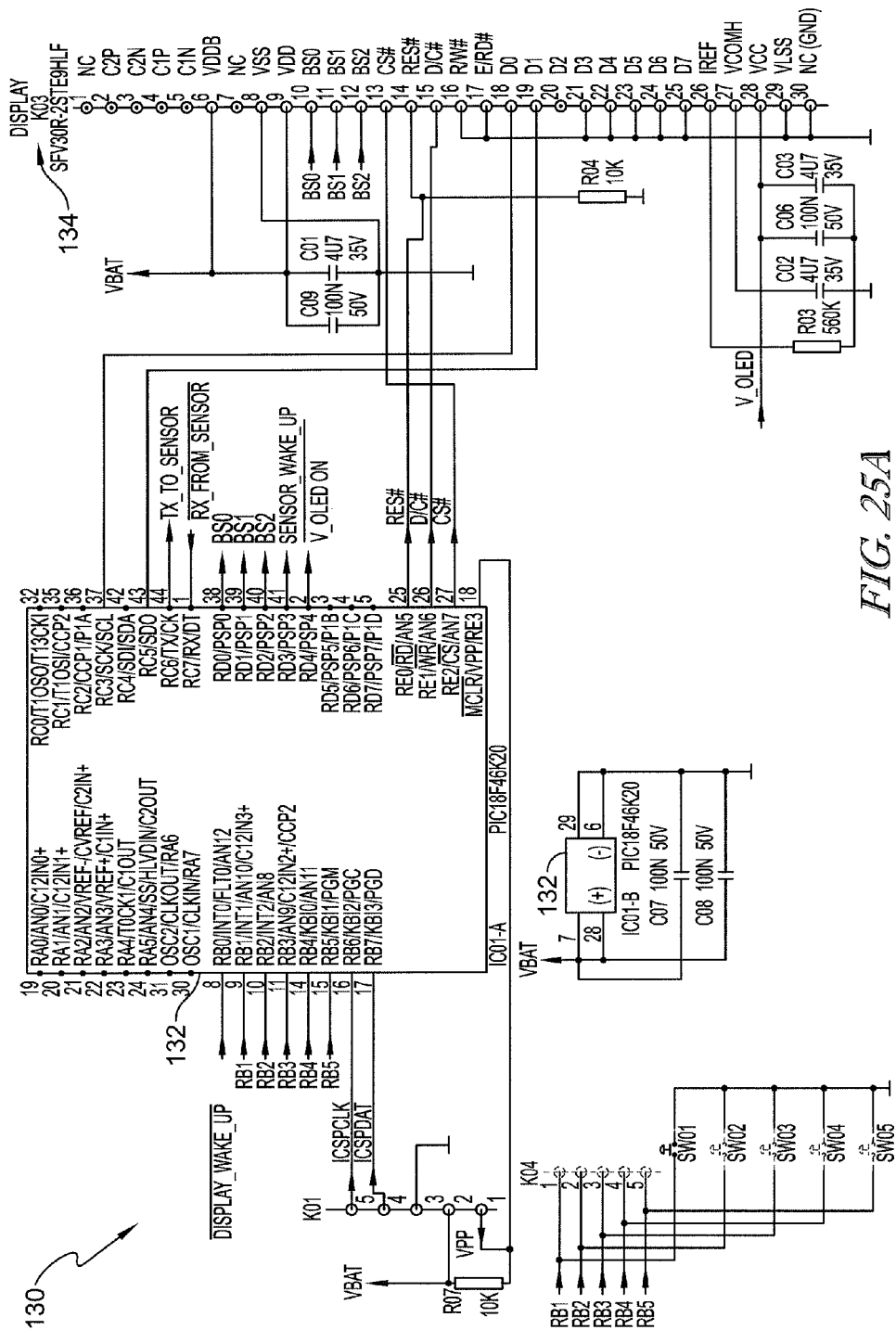
FIGS. 25A-C form a circuit schematic of the circuitry of one embodiment of the counter of FIGS. 1-4 and 10-14.
Figure 25B:
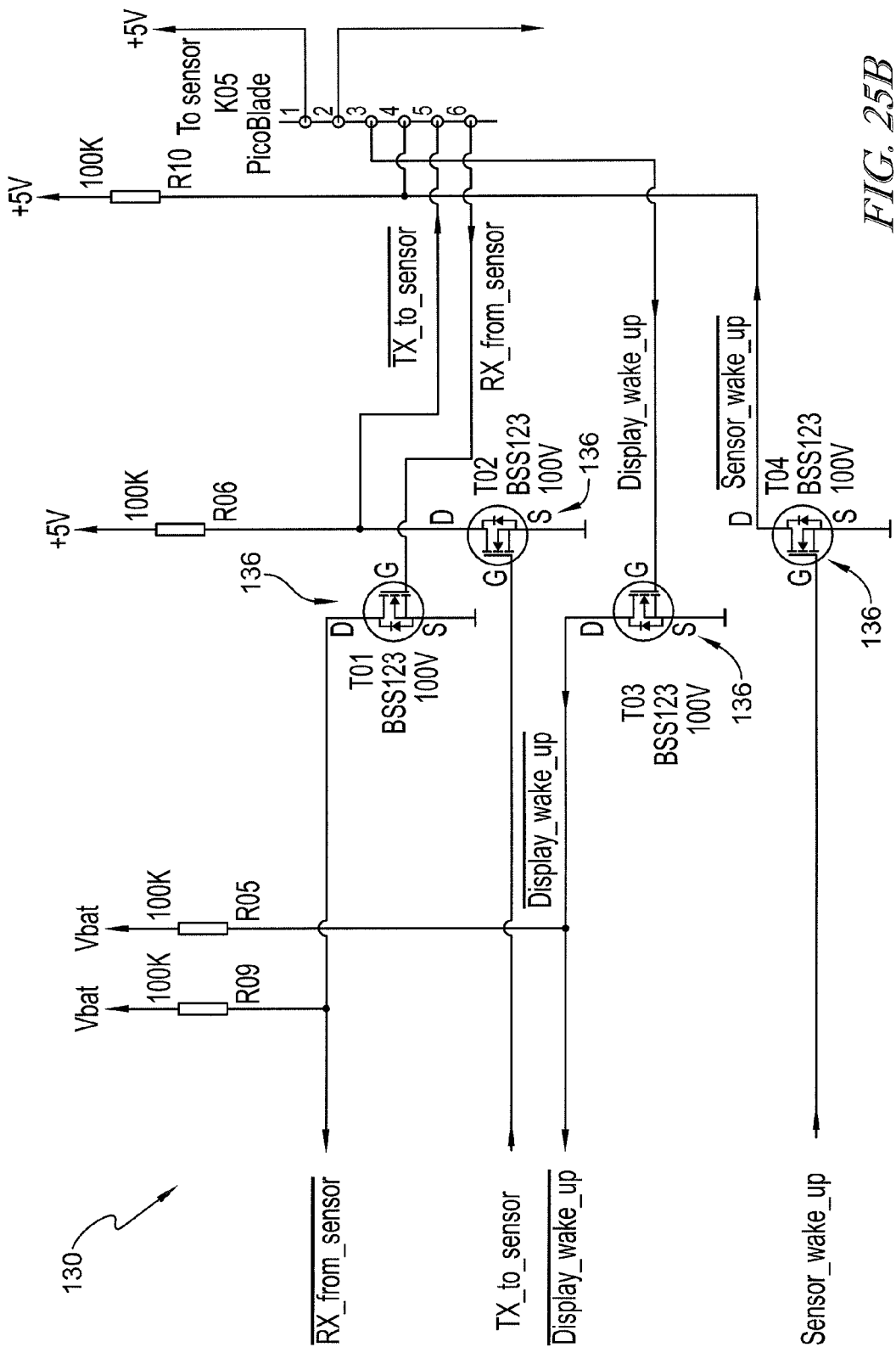
Figure 25C:
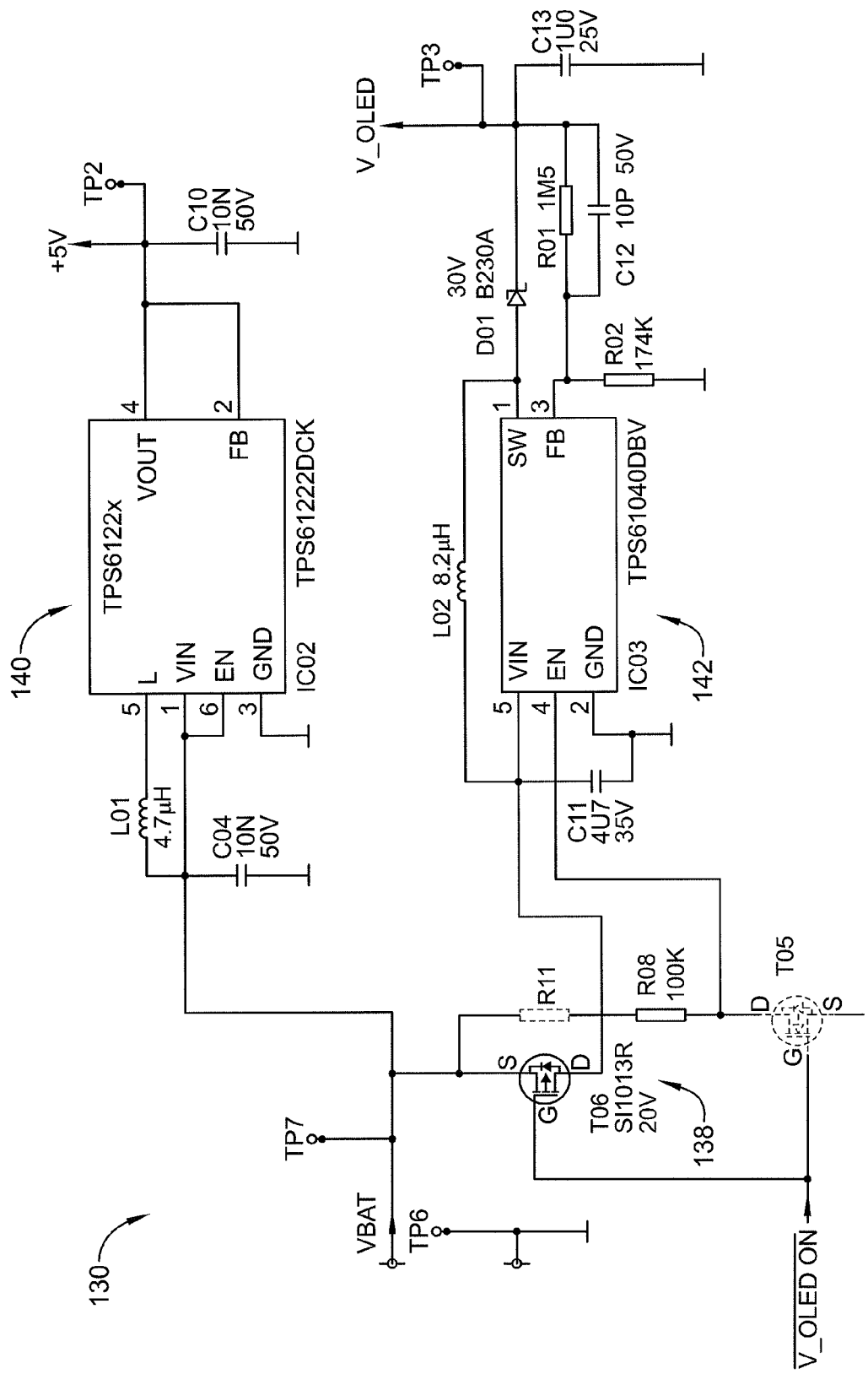

Referring now to FIGS. 25A-C, a circuit schematic of one embodiment of circuitry 130 within counter 12 of FIGS. 1-4 and 10-14 is provided. Circuitry 130 includes a microcontroller 132 which in the illustrative embodiment comprises a model no. PIC 18F46K20 Flash Microcontroller available from Microchip Technology of Chandler, Ariz. as shown in FIG. 25A. Pins 6, 7, 28 and 29 of microcontroller 132 are shown as part of a separate smaller box in the circuit schematic of FIG. 25A. Circuitry 130 also includes a display connector 134 which in the illustrative example is a model no. SFV30R-2STE9HLF connector available from FCI Asia Pte. Ltd. of Singapore, Singapore. FIGS. 25A-C do not show the display to which connector 134 couples but in one embodiment, the display is a model no. QG-2864KSWEG16 OEL Display Module available from Shenzhen Allvision Technology Co. Ltd. of Shenzhen, China.

As shown in FIG. 25B, circuitry 130 includes four field effect transistors (FET's) 136 which in the illustrative example are model no. BSS123 N-Channel Logic Level Enhancement Mode Field Effect Transistors available from Fairchild Semiconductor Corp. of San Jose, Calif. Transistors 136 and PicoBlade connectors interconnect various signal lines between circuitry 130 of display and circuitry 40 of sensor 20 as shown in FIG. 24 and FIG. 25B.

As shown in FIG. 25C, circuitry 130 includes a field effect transistor which in the illustrative embodiment is a model no. Si1013R P-Channel MOSFET available from Vishay Intertechnology, Inc. of Malvern, Pa. As also shown in FIG. 25C, circuitry 130 includes a boost converter 140 which in the illustrative example is a model no. TPS6122x Low Input Voltage, 0.7V Boost Converter with 5.5 µA Quiescent Current available from Texas Instruments, Inc. of Dallas, Tex. Circuitry 130 further includes a second boost converter 142 which in the illustrative example is a model no. TPS61040DBV Low-Power DC/DC Boost Converter available from Texas Instruments, Inc. of Dallas, Tex. The other circuit elements of circuitry 130 comprise standard connectors, switches, resistors, and capacitors having, for example, the resistance and capacitance values indicated in FIGS. 25A-C.

Although certain illustrative embodiments have been described in detail above, many embodiments, variations and modifications are possible that are still within the scope and spirit of this disclosure as described herein and as defined in the following claims.

The invention claimed is:

1. An apparatus for measuring usage of a motor unit having a motor and a motor cable leading to the motor to provide operational power to the motor, the apparatus comprising
    a housing that attaches to the motor cable such that the motor cable passes through an interior region of the housing,
    a sensor situated in the interior region of the housing and operable to sense current flowing in the motor cable, and
    a counter that logs accumulated time of operation of the motor based on an amount of time that current is sensed by the sensor to be flowing in the motor cable, wherein the sensor includes a circuit board situated in the housing and at least one integrated circuit chip on the circuit board, wherein the motor cable is oriented so as to lie adjacent the integrated circuit chip on the circuit board, wherein the sensor includes at least one layer of metallic foil that is wrapped around the circuit board, the integrated circuit chip on the circuit board, and a portion of the motor cable that is situated inside the housing.

2. The apparatus of claim 1, wherein the housing includes a removable cover, a base, a first strain relief at one end of the base, and a second strain relief at the second end of the base, the first strain relief clamps the motor cable to the base at the first end, and the second strain relief clamps the motor cable to the base at the second end.

3. The apparatus of claim 2, wherein the sensor is situated in the base of the housing between the first and second strain reliefs.

4. The apparatus of claim 1, wherein the at least one layer of metallic foil comprises a plurality of layers of metallic foil.

5. The apparatus of claim 2, wherein the base of the sensor housing includes a coupling boss to which the cover is fastened with a fastener, the at least one metallic foil layer includes an aperture through which the coupling boss extends when the at least one layer of metallic foil is wrapped around the circuit board, the integrated circuit chip on the circuit board, and the portion of the motor cable that is situated inside the housing.

6. The apparatus of claim 5, wherein the circuit board includes an opening through which the coupling boss of the base of the sensor housing projects.

7. The apparatus of claim 1, wherein the counter includes a display that is operable to display the accumulated time of use of the motor.

8. The apparatus of claim 7, wherein the accumulated time of use of the motor is displayed for a threshold amount of time after a button on a counter housing is pressed.

9. The apparatus of claim 8, wherein the threshold amount of time is at least five seconds.

10. The apparatus of claim 7, wherein the accumulated time of use of the motor is displayed in minutes and seconds.

11. The apparatus of claim 1, further comprising a cable electrically interconnecting the counter and the sensor in the interior region of the housing.

12. The apparatus of claim 11, wherein the sensor and the counter are electrically powered by at least one battery located in the counter or by an external DC power source.

13. The apparatus of claim 11, wherein the counter has an adhesive patch that permits the counter to be coupled to a surface of a device having the motor unit in spaced relation with the housing in which the sensor is situated.

14. The apparatus of claim 1, wherein the sensor is configured to estimate an amount of current by detecting a strength of a force field in the motor cable.

15. The apparatus of claim 14, wherein estimating the amount of current comprises amplifying and processing the detected force field.

16. The apparatus of claim 1, wherein the counter includes a display that displays information relating to one or more of the following: battery status; overload; counts of cycles; operation time; statistics during time intervals selected from at least one of day, month, and year; load or weight of patient, or service demand or necessity.

17. The apparatus of claim 1, wherein the counter includes wireless communication capability to transmit data to one or more of the following: a handheld display, a hand control, or a network of a healthcare facility.

18. The apparatus of claim 17, wherein the wireless communication capability of the counter includes receiving wirelessly transmitted data from other devices for display or retransmission.

19. The apparatus of claim 1, further comprising an additional cable extending from the counter and coupleable to an output of a control box of the motor unit to receive data therefrom.

20. The apparatus of claim 4, wherein the at least one metallic foil layer of the plurality of metallic foil layers includes a non-metallic backing to prevent the at least one metallic foil layer from shorting out against another metallic foil layer of the plurality of metallic foil layers.

* * * * *